United States Patent
Lee et al.

(10) Patent No.: US 12,376,438 B2
(45) Date of Patent: Jul. 29, 2025

(54) DISPLAY DEVICE AND TILED DISPLAY DEVICE INCLUDING THE SAME

(71) Applicant: Samsung Display Co., LTD., Yongin-si (KR)

(72) Inventors: Kye Uk Lee, Yongin-si (KR); Hyun Joon Kim, Yongin-si (KR); Jung Hwan Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 429 days.

(21) Appl. No.: 17/894,536

(22) Filed: Aug. 24, 2022

(65) Prior Publication Data
US 2023/0238493 A1   Jul. 27, 2023

(30) Foreign Application Priority Data

Jan. 21, 2022   (KR) .......... 10-2022-0009542

(51) Int. Cl.
| | |
|---|---|
| *H10H 20/85* | (2025.01) |
| *G09F 9/302* | (2006.01) |
| *G09F 9/33* | (2006.01) |
| *H10H 20/831* | (2025.01) |
| *H10H 20/857* | (2025.01) |
| *H10H 29/14* | (2025.01) |

(52) U.S. Cl.
CPC ......... *H10H 20/857* (2025.01); *G09F 9/3026* (2013.01); *G09F 9/33* (2013.01); *H10H 20/8312* (2025.01); *H10H 29/142* (2025.01)

(58) Field of Classification Search
None
See application file for complete search history.

(56) References Cited

U.S. PATENT DOCUMENTS

| 10,692,439 B2 | 6/2020 | Kim et al. |
|---|---|---|
| 10,720,117 B2 | 7/2020 | Kim et al. |
| (Continued) | | |

FOREIGN PATENT DOCUMENTS

| CN | 113126379 | 7/2021 |
|---|---|---|
| CN | 113223420 | 8/2021 |
| (Continued) | | |

OTHER PUBLICATIONS

International Search Report, with English translation, for International Application No. PCT/KR2022/018284, dated Feb. 27, 2023.

*Primary Examiner* — Bilkis Jahan
(74) *Attorney, Agent, or Firm* — KILE PARK REED & HOUTTEMAN PLLC

(57) ABSTRACT

A display device includes a display area including light emitting elements in a first pixel row, pixel circuits in a first circuit row and electrically connected to the first pixel row, light emitting elements in a second pixel row between the first pixel row and the first circuit row, pixel circuits in a second circuit row and electrically connected to the second pixel row, and a gate driver including a first stage disposed between the pixel circuits of the first circuit row and a second stage disposed between the pixel circuits of the second circuit row. A distance between adjacent pixel circuits with the first stage between the adjacent pixel circuits in the first circuit row is greater than a distance between other pixel circuits of the first circuit row.

21 Claims, 23 Drawing Sheets

(56) References Cited

U.S. PATENT DOCUMENTS

| | | | |
|---|---|---|---|
| 10,983,381 | B2 | 4/2021 | Jeong et al. |
| 11,514,845 | B2 | 11/2022 | Dai et al. |
| 11,957,010 | B2 | 4/2024 | Jeong et al. |
| 2013/0248829 | A1 | 9/2013 | Smith |
| 2017/0221434 | A1* | 8/2017 | Shima .................. G09G 3/3611 |
| 2018/0190631 | A1 | 7/2018 | Kim et al. |
| 2019/0025636 | A1 | 1/2019 | Xing |
| 2019/0251894 | A1 | 8/2019 | Lee et al. |
| 2019/0355754 | A1* | 11/2019 | Wang ................... H10D 86/441 |
| 2020/0159054 | A1* | 5/2020 | Jeong .................. G02F 1/13336 |
| 2020/0251457 | A1* | 8/2020 | Huang ................ H01L 25/0753 |
| 2021/0012706 | A1* | 1/2021 | Yang ........................ G09G 3/32 |
| 2021/0202676 | A1* | 7/2021 | Jeong ..................... H10K 59/10 |
| 2021/0217353 | A1* | 7/2021 | Zhao ........................ G09G 3/32 |
| 2021/0231993 | A1 | 7/2021 | Jeong et al. |
| 2023/0117897 | A1 | 4/2023 | Kim et al. |

FOREIGN PATENT DOCUMENTS

| | | |
|---|---|---|
| JP | 2017-37298 | 2/2017 |
| KR | 10-2019-0046420 | 5/2019 |
| KR | 10-2020-0060595 | 6/2020 |
| KR | 10-2156785 | 9/2020 |
| KR | 10-2021-0086289 | 7/2021 |
| KR | 10-2021-0131853 | 11/2021 |

\* cited by examiner

PC: PWMC, CGC

DISPLAY DEVICE AND TILED DISPLAY DEVICE INCLUDING THE SAME

CROSS-REFERENCE TO RELATED APPLICATION(S)

This application claims priority to and benefits of Korean Patent Application No. 10-2022-0009542 under 35 U.S.C. § 119, filed on Jan. 21, 2022 in the Korean Intellectual Property Office, the entire contents of which are incorporated herein by reference.

BACKGROUND

1. Technical Field

The disclosure relates to a display device and a tiled display device including the same.

2. Description of the Related Art

Recently, as interest in information display is increased, research and development on a display device is continuously performed. For example, in order to make a large screen display device, a tiled display device in which display devices are connected is being put to practical use. The tiled display device implements a large screen by connecting display panels having a given size.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device in which a distance between some pixel circuits is widened, and a stage of a gate driver is disposed therebetween.

Another object of the disclosure is to provide a tiled display device including the display device.

However, an object of the disclosure is not limited to the above-described objects, and may be varied without departing from the spirit and scope of the disclosure.

A display device may include a display area; and a non-display area adjacent to the display area and including a pad portion. The display area may include light emitting elements disposed in a first direction in a first pixel row; pixel circuits disposed in the first direction in a first circuit row and electrically connected to the light emitting elements of the first pixel row; light emitting elements disposed in the first direction in a second pixel row between the first pixel row and the first circuit row; pixel circuits disposed in the first direction in a second circuit row and electrically connected to the light emitting elements of the second pixel row; and a gate driver including a first stage disposed between the pixel circuits of the first circuit row that provides a gate signal to the pixel circuits of the first circuit row and a second stage disposed between the pixel circuits of the second circuit row that provides a gate signal to the pixel circuits of the second circuit row. A distance between adjacent pixel circuits adjacent with the first stage disposed between the adjacent pixel circuits in the first circuit row may be greater than a distance between other pixel circuits of the first circuit row.

According to an embodiment, the first stage and the second stage may be disposed in a second direction intersecting the first direction between adjacent unit pixel columns.

According to an embodiment, the pixel circuits and the light emitting elements may be shifted with respect to the second direction in a unit pixel column adjacent to the gate driver.

According to an embodiment, a distance between the pixel circuit adjacent to the first stage and a pixel circuit closest to the first stage may be less than a distance between other pixel circuits of the first circuit row.

According to an embodiment, the display area may include light emitting elements disposed in the first direction in a third pixel row between the first circuit row and the second circuit row, pixel circuits disposed in the first direction in a third circuit row adjacent to the second circuit row in the second direction, and a third stage disposed between the pixel circuits of the third circuit row that provides a gate signal to the pixel circuits of the third circuit row.

According to an embodiment, a distance between the first stage and the second stage may be greater than a distance between the second stage and the third stage.

According to an embodiment, the display area may include light emitting elements disposed in the first direction in a fourth pixel row adjacent to the third circuit row in the second direction; light emitting elements disposed in the first direction in a fifth pixel row spaced apart from the fourth pixel row in the second direction; pixel circuits respectively disposed in the first direction in a fourth circuit row and a fifth circuit row successively disposed between the fourth pixel row and the fifth pixel row, a fourth stage disposed between the pixel circuits of the fourth circuit row that provides a gate signal to the pixel circuits of the fourth circuit row; and a fifth stage disposed between the pixel circuits of the fifth pixel row that provides a gate signal to the pixel circuits of the fifth circuit row.

According to an embodiment, a distance between the third stage and the fourth stage may be substantially the same as the distance between the first stage and the second stage, and a distance between the fourth stage and the fifth stage may be substantially the same as a distance between the second stage and the third stage.

According to an embodiment, the display area may include pixel circuits disposed in the first direction in a sixth pixel row spaced apart from the fifth pixel row in the second direction; pixel circuits disposed in the first direction in a sixth circuit row adjacent to the sixth pixel row in the second direction; and a sixth stage disposed between the pixel circuits of the sixth circuit row that provides a gate signal to the pixel circuits of the sixth circuit row. Pixel circuits may not be disposed between the fifth pixel row and the sixth pixel row, and distances between adjacent pixel rows may be equal.

According to an embodiment, a distance between the fifth stage and the sixth stage may be greater than the distance between the first stage and the second stage.

According to an embodiment, the display area may include a demux disposed between the second pixel row and the first circuit row.

According to an embodiment, the display area may include a fan-out area including fan-out lines disposed between the first pixel row and the demux, and the fan-out lines may electrically connect the pad portion and the demux.

According to an embodiment, at least a portion of the fan-out lines may overlap the light emitting elements of the second pixel row in a plan view.

According to an embodiment, the display area may include an electrostatic discharge circuit overlapping the light emitting elements of the first pixel row in a plan view.

According to an embodiment, each of the light emitting elements may be a flip chip micro light emitting diode.

A tiled display device may include display devices and a coupling area connecting between the display devices, and at least one of the display devices may include a display area; and a non-display area adjacent to the display area and including a pad portion. The display area may include light emitting elements disposed in a first direction in a first pixel row; pixel circuits disposed in the first direction in a first circuit row and electrically connected to the light emitting elements of the first pixel row; light emitting elements disposed in the first direction in a second pixel row between the first pixel row and the first circuit row; pixel circuits disposed in the first direction in a second circuit row and electrically connected to the light emitting elements of the second pixel row; and a gate driver including a first stage disposed between the pixel circuits of the first circuit row that provides a gate signal to the pixel circuits of the first circuit row and a second stage disposed between the pixel circuits of the second circuit row that provides a gate signal to the pixel circuits of the second circuit row. A distance between adjacent pixel circuits adjacent with the first stage disposed between the adjacent pixel circuits in the first circuit row may be greater than a distance between other pixel circuits of the first circuit row.

According to an embodiment, the first stage and the second stage may be disposed in a second direction intersecting the first direction between adjacent unit pixel columns, and the pixel circuits and the light emitting elements may be shifted with respect to the second direction in a unit pixel column adjacent to the gate driver.

According to an embodiment, a distance between the pixel circuit adjacent to the first stage and a pixel circuit closest to the pixel circuit may be less than a distance between other pixel circuits of the first circuit row.

According to an embodiment, at least one of the display devices may include a substrate; and a side surface connection line disposed on an upper surface of the substrate, a rear surface of the substrate, and a side surface between the upper surface and the rear surface, and connected to the pad portion. The pad portion may be disposed on the upper surface of the substrate.

According to an embodiment, at least one of the display devices may include a rear surface electrode disposed on the rear surface of the substrate; and a flexible film connected to the rear surface electrode through a conductive adhesive member. The side surface connection line may be electrically connected to the rear surface electrode.

According to an embodiment, each of the light emitting elements may be a flip chip micro light emitting diode.

In the display device according to embodiments of the disclosure, a demux area, a fan-out area, and an electrostatic discharge area may be included in the display area by a position change of first to third circuit rows in the display area. Therefore, the non-display area of the display device may be minimized.

Furthermore, the tiled display device may be designed so that a pixel pitch between adjacent display devices is substantially the same as a pixel pitch inside each of the display devices by minimizing a distance between the display devices through minimization of the non-display area. Therefore, recognition of a coupling area between the display devices by a user is prevented or minimized, sense of disconnection between the display devices may be improved, and thus concentrativeness for an image may be improved.

Stages of the gate driver may be disposed in a circuit row corresponding thereto, by designing a disposition distance of pixel circuits of adjacent unit pixel columns to be relatively wider than other portions. Therefore, an irregularity of a disposition of the pixel circuits and the stages in the pixel area due to the disposition of the demux area, the fan-out area, and the electrostatic discharge area in the display area may be improved.

Accordingly, the number of lines (circuit rows) that may be inspected in auto optical inspection (AOI) that inspects a relative difference in a pattern unit including the same configuration may increase. Therefore, reliability of the display device and the tiled display device including the same may be improved.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
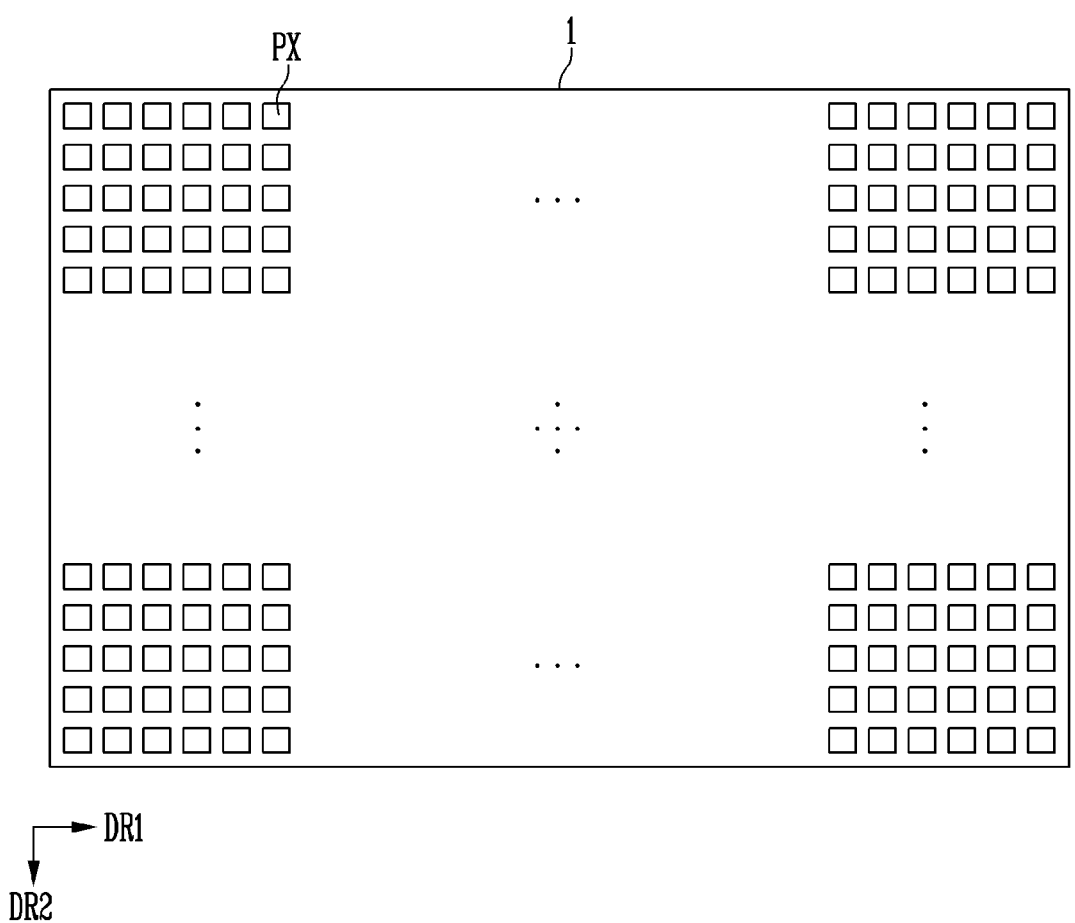
FIG. 1 is a schematic diagram illustrating a display device according to embodiments.

Hereinafter, embodiments of the disclosure are described in more detail with reference to the accompanying drawings. The same reference numerals are used for the same components in the drawings, and a repeated description of the same components may be omitted.

Since an embodiment described in the specification is for clearly describing the spirit of the disclosure to those skilled in the art to which the disclosure pertains, the disclosure is not limited by embodiments described in the specification, and the scope of the disclosure should be interpreted as including modifications or variations within the spirit and the scope of the disclosure.

The drawings attached to the specification are intended to describe the disclosure. Since the shapes shown in the drawings may be exaggerated and displayed as necessary to help with an understanding of the disclosure, the disclosure is not limited by the drawings. For example, the shapes disclosed herein may also include shapes substantial to the shapes disclosed herein.

In the specification, when it is determined that detailed description of a configuration or function related to the disclosure may obscure the subject matter of the disclosure, detailed description thereof may be omitted as necessary.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
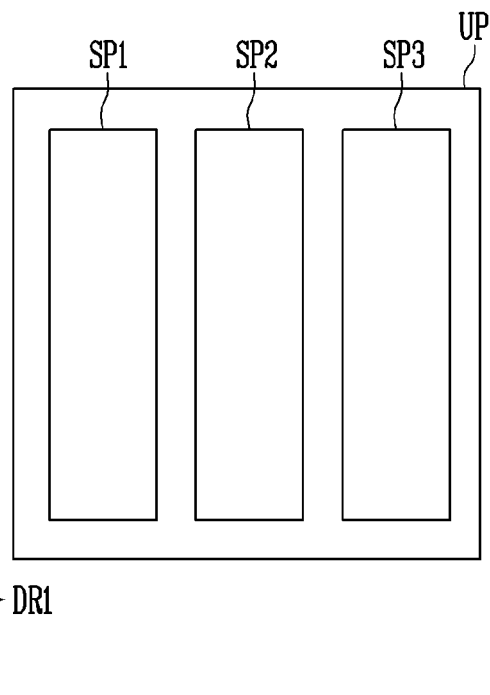
FIG. 2 is a schematic diagram illustrating an example of a pixel included in the display device of FIG. 1.
Figure 3:
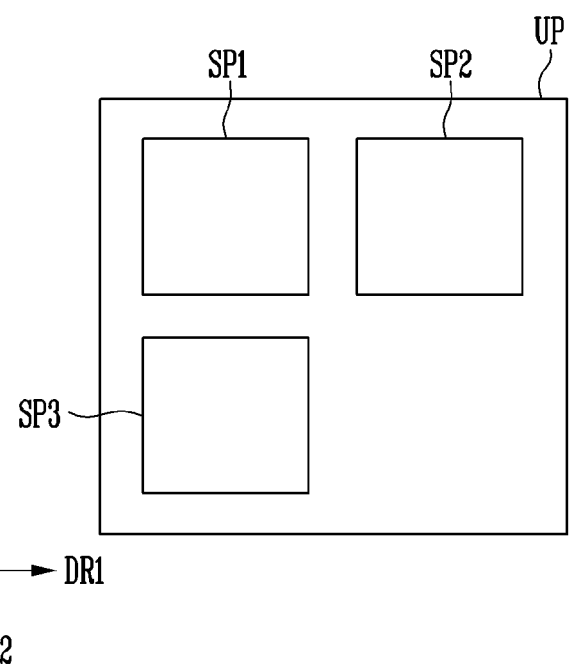
FIG. 3 is a schematic diagram illustrating an example of the pixel included in the display device of FIG. 1.

FIG. 1 is a schematic diagram illustrating a display device according to embodiments, FIG. 2 is a schematic diagram illustrating an example of a pixel included in the display device of FIG. 1, and FIG. 3 is a schematic diagram illustrating another example of the pixel included in the display device of FIG. 1.

Referring to FIGS. 1, 2, and 3, the display device 1 may include pixels PX.

The display device 1 is a device for displaying a video or a still image. The display device 1 may be used as a display screen of various products such as not only a portable electronic device such as a mobile phone, a smart phone, a tablet personal computer (PC), a smart watch, a watch phone, a mobile communication terminal, an electronic notebook, an electronic book, a portable multimedia player (PMP), a navigation device, and an ultra mobile PC (UMPC), but also a television, a notebook computer, a monitor, a billboard, and Internet of things (IOT).

The display device 1 (or a display panel) may be formed in a plane of a rectangular shape having a long side of a first direction DR1 and a short side of a second direction DR2 intersecting the first direction DR1. A corner where the long side of the first direction DR1 and the short side of the second direction DR2 meet may be formed to be rounded to have a curvature or may be formed in a right angle. A planar shape of the display device 1 is not limited to a quadrangle, and may be formed in another polygon, circle, or ellipse. The display device 1 may be a flat display device, but is not limited thereto. For example, the display device 1 may include a curved portion formed at left and right ends and having a constant curvature or a varying curvature. The display device 1 may be flexibly formed to be crooked, curved, bent, folded, or rolled.

Each of the pixels PX may be expressed as a unit pixel UP as shown in FIGS. 2 and 3. Each of the unit pixels UP may include first, second, and third pixels SP1, SP2, and SP3. FIGS. 2 and 3 illustrate that the unit pixel UP may include three pixels SP1, SP2, and SP3, but an embodiment of the specification is not limited thereto.

The first pixel SP1, the second pixel SP2, and the third pixel SP3 may emit light in different colors. Each of the first pixel SP1, the second pixel SP2, and the third pixel SP3 may have a planar shape of a rectangle, a square, or a rhombus. For example, each of the first pixel SP1, the second pixel SP2, and the third pixel SP3 may have a planar shape of a rectangle having a short side of the first direction DR1 and a long side of the second direction DR2 as shown in FIG. 2. By way of example, each of the first pixel SP1, the second pixel SP2, and the third pixel SP3 may have a planar shape of a square or a rhombus as shown in FIG. 3.

In an embodiment, as shown in FIG. 2, the first pixel SP1, the second pixel SP2, and the third pixel SP3 may be arranged (or disposed) in the first direction DR1.

By way of example, any one of the second pixel SP2 and the third pixel SP3 and the first pixel SP1 may be arranged in the first direction DR1, and the other one and the first pixel SP1 may be arranged in the second direction DR2. For example, as shown in FIG. 3, the second pixel SP2 may be arranged in the first direction DR1 with respect to the first pixel SP1, and the third pixel SP3 may be arranged in the second direction DR2 with respect to the first pixel SP1.

The first pixel SP1 may emit first light, the second pixel SP2 may emit second light, and the third pixel SP3 may emit third light. Here, the first light may be light of a red wavelength band, the second light may be light of a green wavelength band, and the third light may be light of a blue wavelength band. The red wavelength band may be a wavelength band of about 600 nm to 750 nm, the green wavelength band may be a wavelength band of about 480 nm to 560 nm, and the blue wavelength band may be a wavelength band of about 370 nm to 460 nm, but an embodiment of the specification is not limited thereto.

Each of the first pixel SP1, the second pixel SP2, and the third pixel SP3 may include an inorganic light emitting element including an inorganic semiconductor as a light emitting element that emits light. For example, the inorganic light emitting element may be a micro light emitting diode (LED) of a flip chip type, but an embodiment of the specification is not limited thereto.

As shown in FIGS. 2 and 3, the area of the first pixel SP1, the area of the second pixel SP2, and the area of the third pixel SP3 may be substantially the same, but are not limited thereto. Here, the area of a pixel may be understood as a planar area of a light emitting element (or a light source) included in a corresponding pixel or a planar area of an emission area of the light emitting element.

At least one of the area of the first pixel SP1, the area of the second pixel SP2, and the area of the third pixel SP3 may be different from another area. By way of example, any two of the area of the first pixel SP1, the area of the second pixel SP2, and the area of the third pixel SP3 may be substantially the same and the other one may be different from the two areas. By way of example, the area of the first pixel SP1, the area of the second pixel SP2, and the area of the third pixel SP3 may be different from each other.

Figure 4:
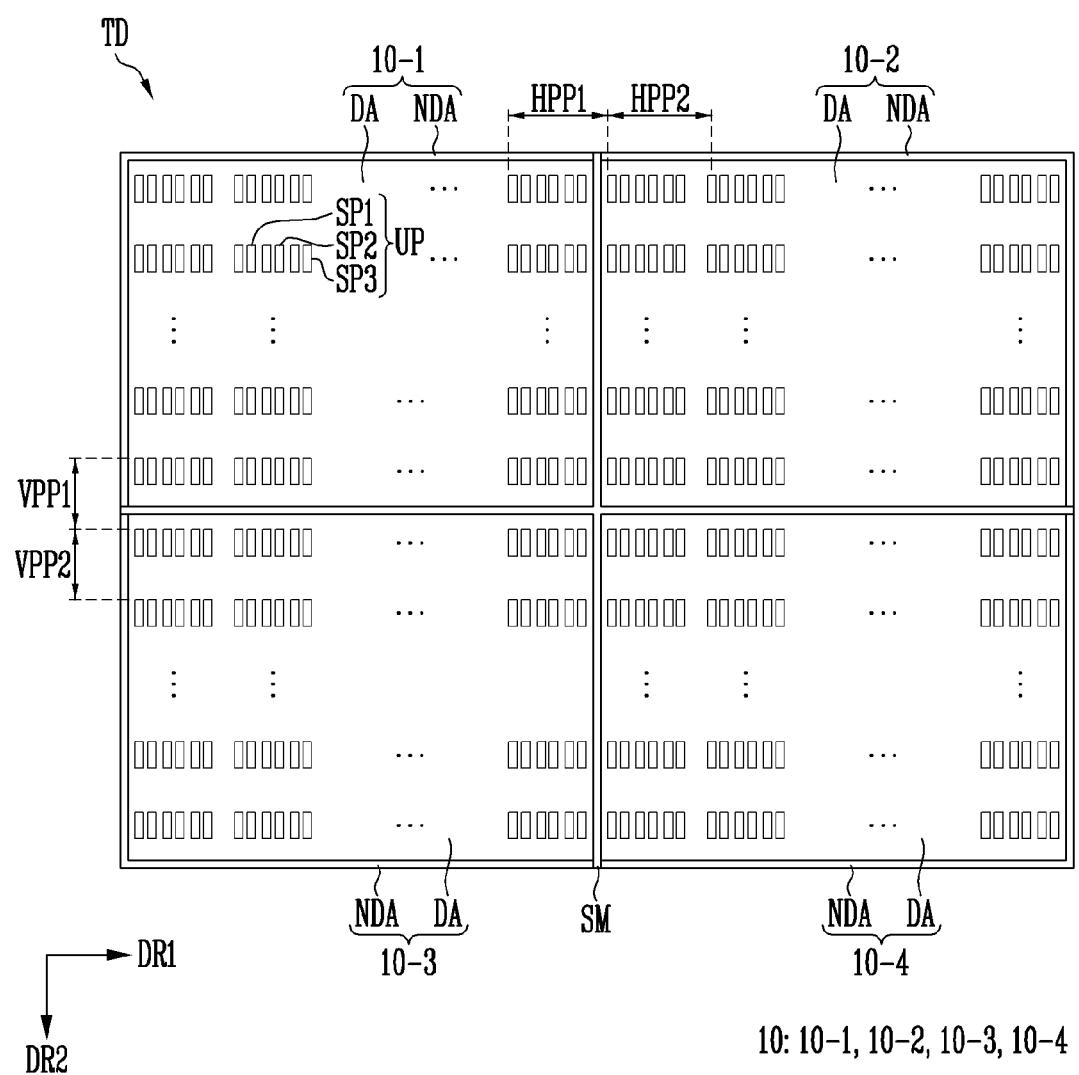
FIG. 4 is a schematic diagram illustrating a tiled display device according to embodiments.

FIG. 4 is a schematic diagram illustrating a tiled display device according to embodiments.

Referring to FIG. 4, the tiled display device TD may include display devices 10.

The display devices 10 may be arranged in a grid shape, but is not limited thereto. As the display devices 10 are connected in the first direction DR1 (or an X-axis direction) or in the second direction DR2 (or a Y-axis direction), the tiled display device TD may have a specific shape. For example, each of the display devices 10 may have the same size, but is not limited thereto. As another example, at least a portion of the display devices 10 may have a size different from others.

The tiled display device TD may include first to fourth display devices 10-1 to 10-4. The number and a connection or a coupling relationship of the display devices 10 are not limited to the embodiment of FIG. 4. The number of display devices 10 may be determined according to a size of the display devices 10 and/or a size of the tiled display device TD.

The first to fourth display devices 10-1 to 10-4 may be fixed to a mounting frame to implement a large screen image.

Each of the display devices 10 may have a rectangle shape including a long side and a short side. The display devices 10 may be disposed with a long side or a short side connected to each other. A portion of the display devices 10 may be disposed at an edge of the tiled display device TD to form one side or a side of the tiled display device TD. Another portion of the display devices 10 may be disposed at a corner of the tiled display device TD, and may form two adjacent sides of the tiled display device TD. Another portion of the display devices 10 may be disposed inside of the tiled display device TD and may be surrounded by other display devices.

Each of the display devices 10 may include a display area DA and a non-display area NDA. The display area DA may include unit pixels UP and may display an image. Each of the unit pixels UP may include the first, second, and third pixels SP1, SP2, and SP3. Each of the first, second, and third pixels SP1, SP2, and SP3 may include a micro LED. However, this is an example, and each of the first, second, and third pixels SP1, SP2, and SP3 may include one of an organic LED including an organic light emitting layer, a quantum dot LED including a quantum dot light emitting layer, and an inorganic LED including an inorganic semiconductor. Hereinafter, description is given assuming, for example, that each of the first, second, and third pixels SP1, SP2, and SP3 may include a micro LED.

The non-display area NDA may be disposed around the display area DA and may surround at least a portion of the display area DA. The non-display area NDA may not display an image.

The display devices 10 may include the first, second, and third pixels SP1, SP2, and SP3 arranged along rows and columns in the display area DA. Each of the first, second, and third pixels SP1, SP2, and SP3 may include an emission area or an opening area defined by a pixel defining layer or a bank, and may emit light having a peak wavelength through the emission area or the opening area. The emission area may be an area in which light generated by light emitting elements of each of the first, second, and third pixels SP1, SP2, and SP3 is emitted to the outside of the display devices 10.

The first, second, and third pixels SP1, SP2, and SP3 may be sequentially and repeatedly disposed along the first direction DR1 of the display area DA.

The tiled display device TD may have an overall planar shape, but is not limited thereto. The tiled display device TD may have a stereoscopic shape, thereby providing a stereoscopic effect to a user. For example, in case that the tiled display device TD has a stereoscopic shape, at least a portion of the display devices 10 may have a curved shape. As another example, each of the display devices 10 may have a planar shape and may be connected to each other at an angle, and thus the tiled display device TD may have a stereoscopic shape.

The tiled display device TD may include a coupling area SM disposed between the display areas DA. The tiled display device TD may be formed by connecting the non-display areas NDA of each of adjacent display devices 10. The display devices 10 may be connected to each other through a coupling member or an adhesive member disposed in the coupling area SM.

A distance between the display areas DA of each of the display devices 10 may be so close that the coupling area SM is not recognized by the user. For example, a first horizontal pixel pitch HPP1 between pixels of the first display device 10-1 and pixels of the second display device 10-2 may be substantially the same as a second horizontal pixel pitch HPP2 between the pixels of the second display device 10-2. A first vertical pixel pitch VPP1 between the pixels of the first display device 10-1 and pixels of the third display device 10-3 may be substantially the same as a second vertical pixel pitch VPP2 between the pixels of the third display device 10-3.

Therefore, the tiled display device TD may improve sense of disconnection between the display devices 10 and improve concentrativeness for an image by preventing the coupling area SM between the display devices 10 from being recognized by the user.

Figure 5:
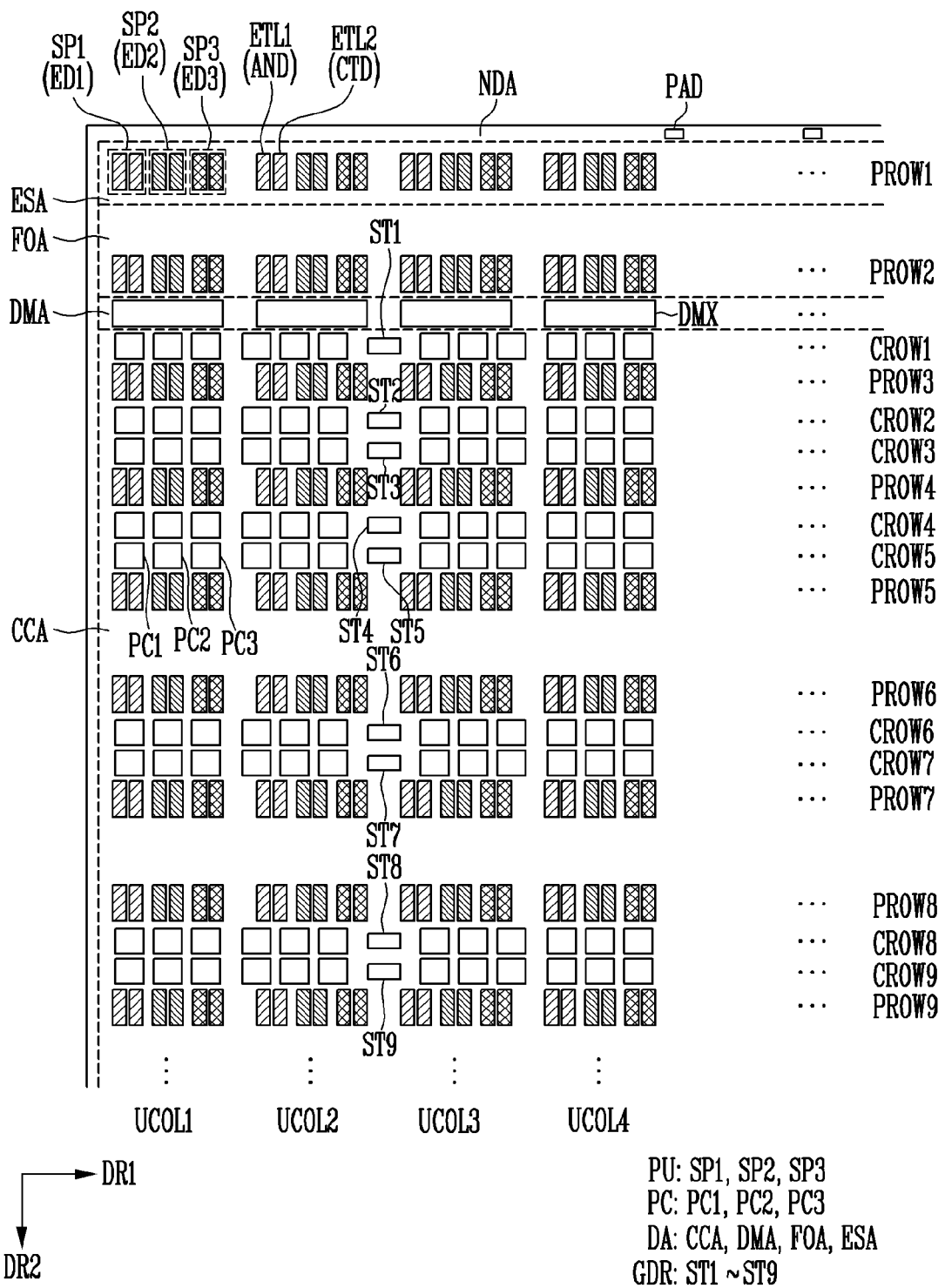
FIG. 5 is a schematic plan view illustrating a display device according to embodiments.
Figure 6:
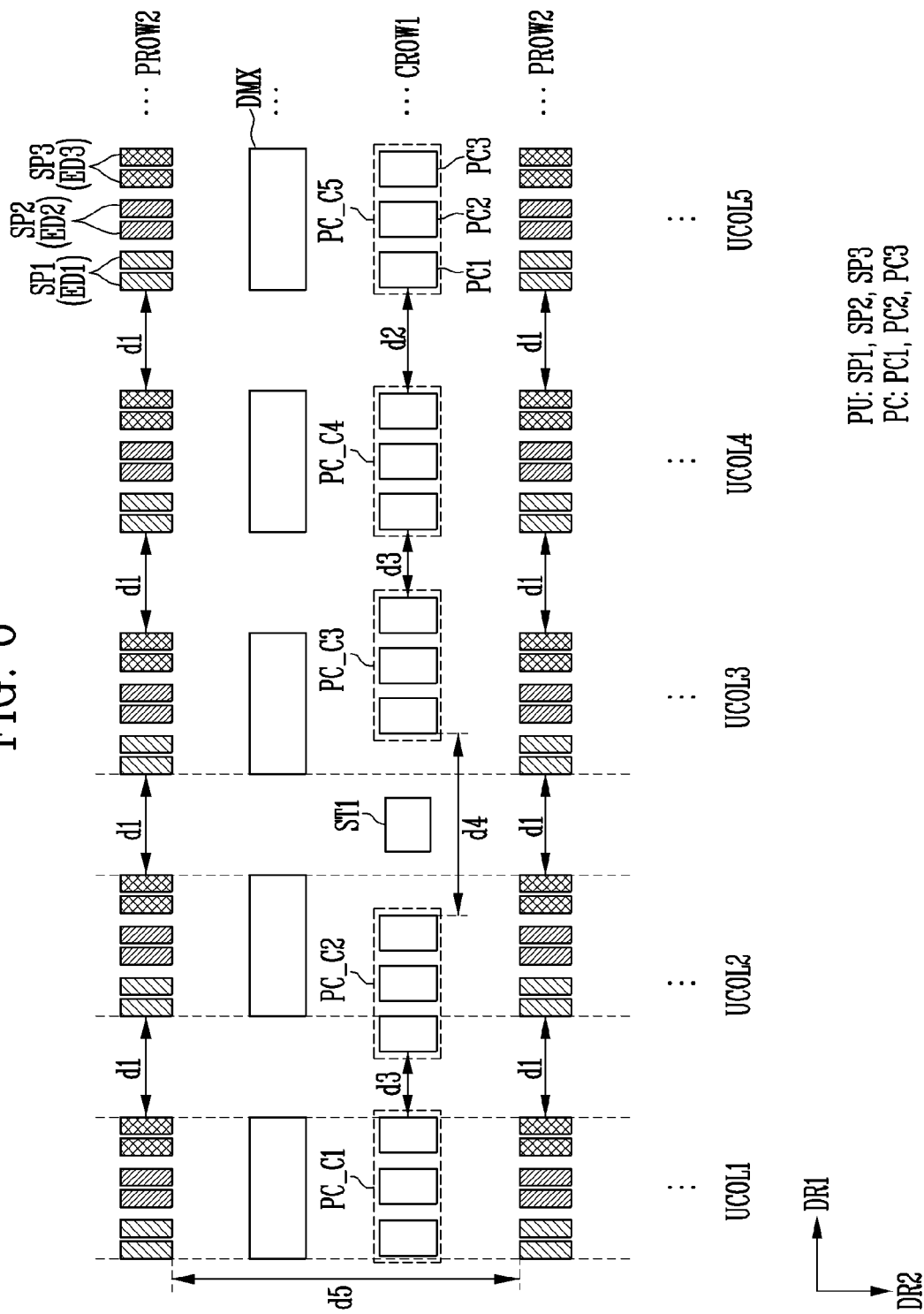
FIG. 6 is a schematic plan view illustrating an example of a portion of the display device of FIG. 5.
Figure 7:
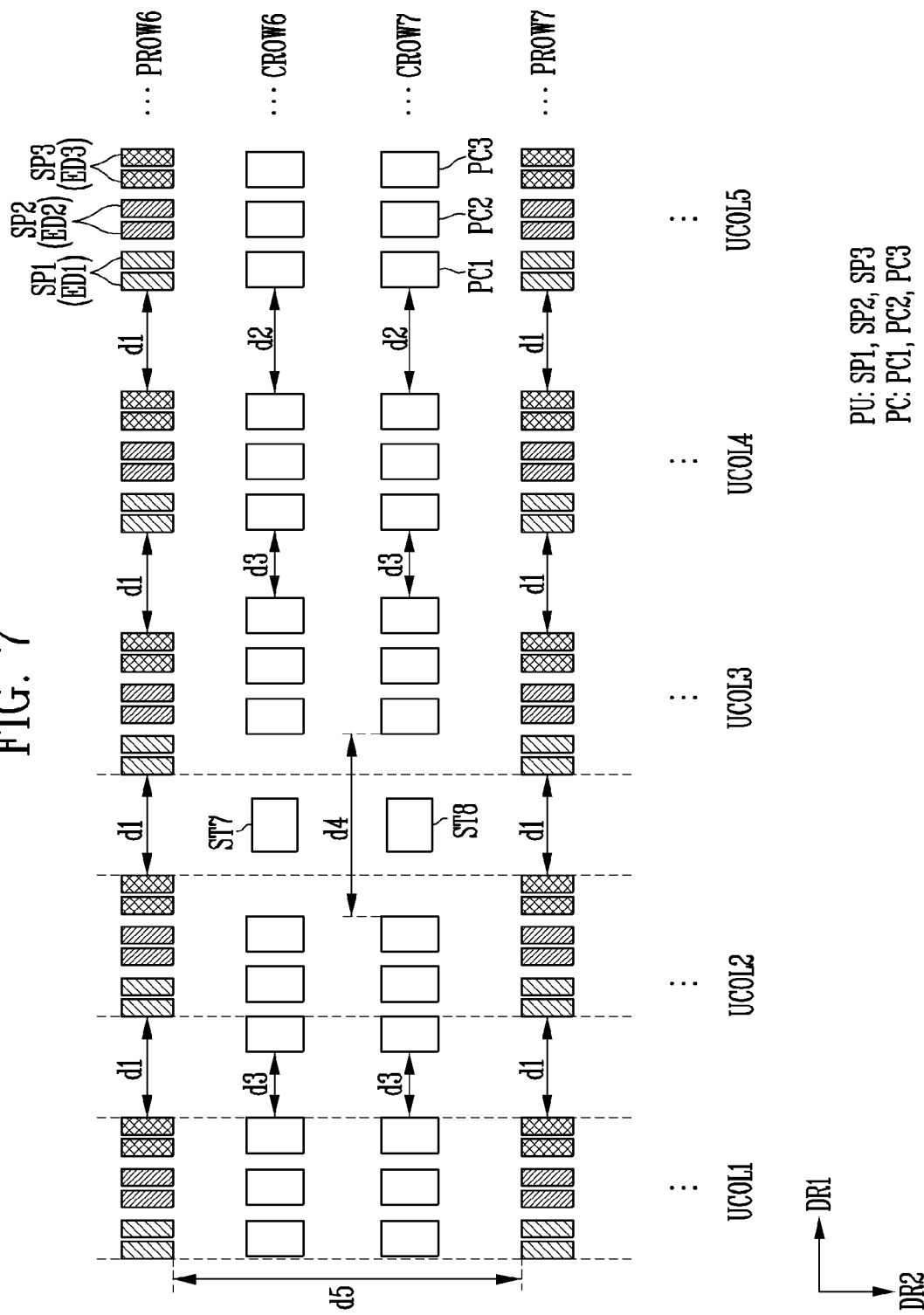
FIG. 7 is a schematic plan view illustrating an example of another portion of the display device of FIG. 5.

FIG. 5 is a schematic plan view illustrating a display device according to embodiments of the disclosure, FIG. 6 is a schematic plan view illustrating an example of a portion of the display device of FIG. 5, and FIG. 7 is a schematic plan view illustrating an example of another portion of the display device of FIG. 5.

Referring to FIGS. 4, 5, 6, and 7, each of the display devices 10 may include the display area DA and the non-display area NDA. FIG. 5 shows a portion of the first display device 10-1.

Hereinafter, embodiments of the disclosure are described based on a configuration of the first display device 10-1. The second display device 10-2, the third display device 10-3, and the fourth display device 10-4 may have a configuration substantially identical to or similar to that of the first display device 10-1.

The display area DA may include a pixel circuit area CCA, a demux area DMA, a fan-out area FOA, and an electrostatic discharge area ESA. In an embodiment, the demux area DMA, the fan-out area FOA, and the electrostatic discharge area ESA may be disposed at an edge of at least one side or a side of the display area DA. In FIG. 5, the demux area DMA, the fan-out area FOA, and the electrostatic discharge area ESA are disposed at an upper edge of the display area DA, but a disposition position thereof is not limited thereto. As another example, at least one of the demux area DMA, the fan-out area FOA, and the electrostatic discharge area ESA may be further disposed at at least one of a lower edge, a left edge, and a right edge of the first display device 10-1.

The non-display area NDA may include pad portions PAD. In an embodiment, the pad portion PAD may electrically connect various driving circuits disposed on a rear surface of the first display device 10-1 and circuits of the display area DA through signal lines.

The unit pixel UP may include the first, second, and third pixels SP1, SP2, and SP3. Each of the first, second, and third pixels SP1, SP2, and SP3 may include a first pixel electrode ETL1 (an anode AND, or a pixel electrode), and a second pixel electrode ETL2 (a cathode CTD, or a common electrode). For example, in each of pixel rows, an arrangement of the first direction DR1 of the first and second pixel electrodes ETL1 and ETL2 of the first pixel SP1, the first and second pixel electrodes ETL1 and ETL2 of the second pixel SP2, and the first and second pixel electrodes ETL1 and ETL2 of the third pixel SP3 may be repeated.

The first pixel SP1 may include a first light emitting element ED1 electrically connected to the first pixel electrode ETL1 and the second pixel electrode ETL2. Furthermore, the first pixel SP1 may further include a first pixel circuit PC1 electrically connected to the first light emitting element ED1 through the first pixel electrode ETL1 included therein.

The second pixel SP2 may include a second light emitting element ED2 electrically connected to the first pixel electrode ETL1 and the second pixel electrode ETL2. The second pixel SP2 may further include a second pixel circuit PC2 electrically connected to the second light emitting element ED2 through the first pixel electrode ETL1 included therein.

The third pixel SP3 may include a third light emitting element ED3 electrically connected to the first pixel electrode ETL1 and the second pixel electrode ETL2. The third pixel SP3 may further include a third pixel circuit PC3 electrically connected to the third light emitting element ED3 through the first pixel electrode ETL1 included therein.

In an embodiment, each of the first light emitting element ED1, the second light emitting element ED2, and the third light emitting element ED3 may be disposed to be overlapped on the first pixel electrode ETL1 and the second pixel electrode ETL2 corresponding thereto.

Hereinafter, for convenience of description, the first and second pixel electrodes ETL1 and ETL2 and/or the first light emitting element ED1 of the first pixel SP1 are/is described as the first pixel SP1 in the drawings. Similarly, the first and second pixel electrodes ETL1 and ETL2 and/or the second light emitting element ED2 of the second pixel SP2 are/is described as the second pixel SP2, and the first and second pixel electrodes ETL1 and ETL2 and/or the third light emitting element ED3 of the third pixel SP3 are/is described as the third pixel SP3. Description is given assuming, for example, that each unit pixel UP has a configuration including the first, second, and third pixels SP1, SP2, and SP3 defined as described above.

Although one light emitting element is disposed in one pixel in FIG. 5, the disclosure is not limited thereto. For example, each of the first, second, and third pixels SP1, SP2, and SP3 may include at least two light emitting elements. For example, each of the first, second, and third pixels SP1, SP2, and SP3 may include a main light emitting element and a repair light emitting element.

The first, second, and third pixels SP1, SP2, and SP3 may be disposed in the electrostatic discharge area ESA, the fan-out area FOA, the demux area DMA, and the pixel circuit area CCA.

The unit pixels UP may be arranged to have a substantially uniform pixel pitch. For example, pixel pitches (for example, horizontal distances) between unit pixels UP adjacent in the first direction DR1 may be substantially uniform. Pixel pitches (for example, vertical distances) between unit pixels UP adjacent in the second direction DR2 may be substantially uniform.

The unit pixels UP may be arranged along pixel rows and unit pixel columns. For example, the first, second, and third pixels SP1, SP2, and SP3 may be arranged in first to ninth pixel rows PROW1, PROW2, PROW3, PROW4, PROW5, PROW6, PROW7, PROW8, and PROW9. The first to ninth pixel rows PROW1, PROW2, PROW3, PROW4, PROW5, PROW6, PROW7, PROW8, and PROW9 may be sequentially arranged along the second direction DR2. Since sense of difference or the like of an image may be minimized in a case where the first to ninth pixel rows PROW1, PROW2, PROW3, PROW4, PROW5, PROW6, PROW7, PROW8, and PROW9 including actual emission areas are required to be arranged at a uniform distance, the first to ninth pixel rows PROW1, PROW2, PROW3, PROW4, PROW5, PROW6, PROW7, PROW8, and PROW9 may be arranged at substantially the same distance (for example, a fifth distance d5 shown in FIGS. 6 and 7). Furthermore, all pixel rows may be arranged at a uniform distance (for example, the fifth distance d5).

In the specification, the unit pixel column may be understood as a column (a pixel column) defined by the unit pixels UP arranged (or disposed) along the second direction DR2. For example, first to fourth unit pixel columns UCOL1, UCOL2, UCOL3, and UCOL4 are shown in FIG. 5. Since sense of difference or the like of an image is minimized in a case where the unit pixels UP disposed based on the first to fourth unit pixel columns UCOL1, UCOL2, UCOL3, and UCOL4 are also required to be disposed at substantially the same distance, the unit pixels UP of the first to fourth unit pixel columns UCOL1, UCOL2, UCOL3, and UCOL4 may be arranged at substantially the same distance (for example, a first distance d1 shown in FIGS. 6 and 7). Furthermore, all unit pixel columns may be arranged at a uniform distance (for example, the first distance d1). It is to be understood that a fifth unit pixel column UCOL5 may also be included in addition to other unit pixel columns.

The pixel circuit PC may be disposed in the pixel circuit area CCA. The pixel circuit PC may include the first, second, and third pixel circuits PC1, PC2, and PC3. The first pixel circuit PC1 may supply a driving current to the first light emitting element ED1 of the first pixel SP1, the second pixel circuit PC2 may supply a driving current to the second light emitting element ED2 of the second pixel SP2, and the third pixel circuit PC3 may supply a driving current to the third light emitting element ED3 of the third pixel SP3. The pixel circuit PC may be arranged along circuit rows. The first, second, and third pixel circuits PC1, PC2, and PC3 may be arranged repeatedly in the first direction DR1 in first to seventh circuit rows CROW1, CROW2, CROW3, CROW4, CROW5, CROW6, and CROW7. The first to seventh circuit rows CROW1, CROW2, CROW3, CROW4, CROW5, CROW6, and CROW7 may be sequentially arranged in the second direction DR2.

The first pixel row PROW1 may be disposed at an outermost (for example, an uppermost end) of the display area DA. The first pixel row PROW1 may be disposed at one edge or an upper edge or an edge of the display area DA.

An electrostatic discharge circuit of the electrostatic discharge area ESA may be disposed on a layer different from that of the first, second, and third pixels SP1, SP2, and SP3. In an embodiment, the first pixel row PROW1 may overlap the electrostatic discharge area ESA. Accordingly, the area of the non-display area NDA may be minimized and/or reduced.

The first pixel row PROW1 and the first circuit row CROW1 may be electrically connected to each other. For example, the pixels SP1, SP2, and SP3 of the first pixel row PROW1 may be respectively connected to the pixel circuits PC1, PC2, and PC3 of the first circuit row CROW1.

In an embodiment, the first pixel row PROW1 and the first circuit row CROW1 may be spaced apart from each other in the second direction DR2 with another configuration therebetween. For example, the second pixel row PROW2 may be disposed between the first pixel row PROW1 and the first circuit row CROW1. In an embodiment, the fan-out area FOA may be disposed between the first pixel row PROW1 and the first circuit row CROW1. Fan-out lines of the fan-out area FOA may be disposed on a layer different from that of the first, second, and third pixels SP1, SP2, and SP3. For example, in order to minimize the non-display area NDA, the fan-out area FOA may be disposed inside the display area DA.

The fan-out lines of the fan-out area FOA may be formed on a same layer as the pixel circuit PC. For example, the fan-out lines may be formed in a space where the first circuit row CROW1 is to be originally disposed in the display area DA. Since the first pixel row PROW1 and the second pixel row PROW2 are required to be maintained at the same distance as other pixel rows, the first circuit row CROW1 may be disposed below (or inside) the second pixel row PROW2.

The second pixel row PROW2 may be disposed inside the display area DA than the first pixel row PROW1. In an embodiment, the second pixel row PROW2 may overlap the fan-out area FOA.

The second pixel row PROW2 and the second circuit row CROW2 may be spaced apart from each other in the second direction DR2. In an embodiment, the first circuit row CROW1 and the third pixel row PROW3 may be disposed between the second pixel row PROW2 and the second circuit row CROW2.

In an embodiment, the second circuit row CROW2 may be disposed between the third pixel row PROW3 and the fourth pixel row PROW4. The second pixel row PROW2 and the second circuit row CROW2 may be electrically connected to each other. For example, the pixels SP1, SP2, and SP3 of the second pixel row PROW2 may be respectively connected to the pixel circuits PC1, PC2, and PC3 of the second circuit row CROW2.

In an embodiment, the demux area DMA including demuxes DMX may be disposed between the second pixel row PROW2 and the first circuit row CROW1. The demux DMX may supply a data signal (or a data voltage) provided from the fan-out line to corresponding data lines in a time division method.

The demuxes DMX may be formed on a same layer as the pixel circuit PC. For example, the demuxes DMX may be formed in a space where the second circuit row CROW2 is to be originally disposed. Since the second pixel row PROW2 and the third pixel row PROW3 are required to be maintained at the same distance as other pixel rows, the second circuit row CROW2 may be disposed below (or inside) the third pixel row PROW3.

The third pixel row PROW3 may be disposed inside the display area DA than the second pixel row PROW2. The third pixel row PROW3 and the third circuit row CROW3 may be spaced apart from each other in the second direction DR2. The second circuit row CROW2 may be disposed between the third pixel row PROW3 and the third circuit row CROW3.

The fourth and fifth pixel rows PROW4 and PROW5 may be disposed inside the display area DA than the third pixel row PROW3. The fourth pixel row PROW4 and the fourth circuit row CROW4 may be adjacent to each other in the second direction DR2, and the fifth pixel row PROW5 and the fifth circuit row CROW5 may be adjacent to each other in the second direction DR2. In an embodiment, the fourth and fifth circuit rows CROW4 and CROW5 may be disposed between the fourth pixel row PROW4 and the fifth pixel row PROW5.

The sixth and seventh pixel rows PROW6 and PROW7 may be disposed inside the display area DA than the fifth pixel row PROW5. The sixth and seventh pixel rows PROW6 and PROW7 may be disposed in the pixel circuit area CCA. The sixth pixel row PROW6 and the sixth circuit row CROW6 may be adjacent to each other in the second direction DR2, and the seventh pixel row PROW7 and the seventh circuit row CROW7 may be adjacent to each other in the second direction DR2. The sixth and seventh circuit rows CROW6 and CROW7 may be disposed between the sixth pixel row PROW6 and the seventh pixel row PROW7.

As described above, since each of the pixel rows is required to maintain a uniform distance, a space (for example, a space including a length corresponding to the fifth distance d5) where two circuit rows may be disposed may be formed between the fifth pixel row PROW5 and the sixth pixel row PROW6. Signal lines may be disposed or extended in the corresponding space.

The gate driver GDR may be disposed in the pixel circuit area CCA. The gate driver GDR may supply a gate signal to a gate line connected to the pixel circuit PC. The gate driver GDR may be connected to a clock line, a voltage line, and a signal line extending from the pixel circuit area CCA.

In an embodiment, the gate driver GDR may be disposed between two adjacent unit pixel columns. For example, as shown in FIG. 5, the gate driver GDR may be disposed between the second unit pixel column UCOL2 and the third unit pixel column UCOL3.

In an embodiment, the gate driver GDR may include at least one of an initialization scan driver, a write scan driver, a control scan driver, a sweep driver, a PWM (for example, Pulse Width Modulation) emission driver, and a PAM (for example, Pulse Amplitude Modulation) emission driver. For example, the gate driver GDR disposed between the second unit pixel column UCOL2 and the third unit pixel column UCOL3 of FIG. 5 may be one of the initialization scan driver, the write scan driver, the control scan driver, the sweep driver, the PWM emission driver, and the PAM emission driver. Each of the initialization scan driver, the write scan driver, the control scan driver, the sweep driver, the PWM emission driver, and the PAM emission driver may be disposed between different unit pixel columns.

The gate driver GDR may include stages ST1, ST2, ST3, ST4, ST5, ST6, ST7, ST8, and ST9. Each of the first to ninth stages ST1 to ST9 may be disposed in the first to ninth circuit rows CROW1 to CROW9. The first to ninth stages ST1 to ST9 may be arranged along the second direction DR2.

In case that the gate driver GDR may include the write scan driver, each of the first to ninth stages ST1 to ST9 may output a write scan signal.

The first stage ST1 may supply a gate signal to a gate line disposed in the first circuit row CROW1. In an embodiment, the first stage ST1 may be disposed between the pixel circuits PC of the first circuit row CROW1. The first stage ST1 may supply the gate signal to the pixel circuits PC of the first circuit row CROW1 through the gate line.

For example, the first stage ST1 may be disposed in a space between the second unit pixel column UCOL2 and the third unit pixel column UCOL3 on the first circuit row CROW1. In FIG. 6, for convenience of description, the pixel circuits PC disposed in the first circuit row CROW1 are respectively defined as a first column pixel circuit PC_C1, a second column pixel circuit PC_C2, a third column pixel circuit PC_C3, a fourth column pixel circuit PC_C4, and a fifth column pixel circuit PC_C5 based on the unit pixel column of the unit pixel PU connected to the pixel circuits PC. Each of the first column pixel circuit PC_C1, the second column pixel circuit PC_C2, the third column pixel circuit PC_C3, the fourth column pixel circuit PC_C4, and the fifth column pixel circuit PC_C5 may include the first, second, and third pixel circuits PC1, PC2, and PC3.

In order to secure a space in which the first stage ST1 is to be disposed, adjacent pixel circuits of the first stage ST1 (for example, the second column pixel circuit PC_C2 the third column pixel circuit PC_C3 of FIG. 6) may be disposed at both sides, respectively, at a distance (for example, a fourth distance d4) wider than distances between other pixel circuits of the first circuit row CROW1. For example, the second column pixel circuit PC_C2 may be shifted to a left side relative to the second unit pixel column UCOL2 and the unit pixels UP included therein and may be disposed. The third column pixel circuit PC_C3 may be shifted to a right side relative to the third unit pixel column UCOL3 and the unit pixels UP included therein and may be disposed.

On the other hand, other pixel circuits (for example, the first, fourth, and fifth column pixel circuits PC_C1, PC_C4, and PC_C5) of the first circuit row CROW1, which are not adjacent to the first stage ST1 may be disposed according to the unit pixel columns corresponding to each of the other pixel circuits.

Therefore, a distance between the second column pixel circuit PC_C2 and the first column pixel circuit PC_C1 which is the closest pixel circuit thereto may be a third distance d3 and may be less than distances d2 and d4 between the other pixel circuits of the first circuit row CROW1. A distance between the third column pixel circuit PC_C3 and the fourth column pixel circuit PC_C4 shifted by a disposition of the first stage ST1 may also be the third distance d3. However, this is an example, and according to a design, the distance between the second column pixel circuit PC_C2 and the first column pixel circuit PC_C1 may be difference from the distance between the third column pixel circuit PC_C3 and the fourth column pixel circuit PC_C4.

Here, a distance between the fourth column pixel circuit PC_C4 and the fifth column pixel circuit PC_C5, which are pixel circuits that are not adjacent to the first stage ST1, may be a second distance d2.

As described above, in order to secure a space in which the first stage ST1 is disposed in the first circuit row CROW1, the adjacent second and third column pixel circuits PC_C2 and PC_C3 of the first stage ST1 may be shifted and disposed at the both sides. The second column pixel circuit PC_C2 may be arranged to be shifted in a diagonal direction of the second direction DR2 with respect to the light emitting elements ED1, ED2, and ED3 of the second unit pixel column UCOL2. The third column pixel circuit PC_C3 may be arranged to be shifted in a diagonal direction of the second direction DR2 with respect to the light emitting elements ED1, ED2, and ED3 of the third unit pixel column UCOL3.

The second stage ST2 may supply a gate signal to a gate line disposed in the second circuit row CROW2. In an embodiment, the second stage ST2 may be disposed between the pixel circuits PC of the second circuit row CROW2. The second stage ST2 may supply the gate signal to the pixel circuits PC of the second circuit row CROW2 through the gate line.

For example, the second stage ST2 may be disposed in a space between the second unit pixel column UCOL2 and the third unit pixel column UCOL3 on the second circuit row CROW2. A position relationship (a distance and the like) between the second stage ST2 and the pixel circuits SP in the second circuit row CROW2 may be substantially the same as a position relationship (the distance and the like) between the second stage ST2 and the pixel circuits SP in the first circuit row CROW1 described with reference to FIG. 6.

The third stage ST3 may supply a gate signal to a gate line disposed in the third circuit row CROW3. In an embodiment, the third stage ST3 may be disposed between the pixel circuits PC of the third circuit row CROW3. For example, the third stage ST3 may be disposed in a space between the second unit pixel column UCOL2 and the third unit pixel column UCOL3 on the third circuit row CROW3.

Similarly, each of the fourth to ninth stages ST4 to ST9 may supply a gate signal to a gate line disposed in the fourth to ninth circuit rows CROW4 to CROW9. In an embodiment, the fourth to ninth stages ST4 to ST9 may be disposed between the pixel circuits PC in the fourth to ninth circuit rows CROW4 to CROW9, respectively. For example, the fourth to ninth stages ST4 to ST9 may be disposed in a space between the second unit pixel column UCOL2 and the third unit pixel column UCOL3.

FIG. 7 shows a position and a disposition relationship between components disposed in the sixth and seventh pixel rows PROW6 and PROW7 and the sixth and seventh circuit rows CROW6 and CROW7, which are substantially identical to or similar to the contents described above with reference to FIGS. 5 and 6, and thus a repetitive description is omitted.

As described above, the demux area DMA, the fan-out area FOA, and the electrostatic discharge area ESA may be included in the display area DA due to a position change of the first to third circuit rows CROW1, CROW2, and CROW3 in the display area DA of the display devices 10. Therefore, the non-display area NDA of the display devices 10 may be minimized.

Furthermore, the tiled display device TD may minimize the distance between the display devices 10 through the minimization of the non-display area NDA, and thus the pixel pitch between the adjacent display devices 10 may be designed to be the same as the pixel pitch inside each of the display devices 10. Therefore, recognition of the coupling area SM between the display devices 10 by the user may be prevented or minimized, and sense of disconnection between the display devices 10 may be improved, thereby improving the concentrativeness for the image.

The stages ST1 to ST9 of the gate driver GDR may be disposed in the circuit rows CROW1 to CROW9 corresponding thereto by designing a disposition distance of the pixel circuits of adjacent unit pixel columns to be relatively wider than other portions. Therefore, an irregularity of disposition of the pixel circuits and the stages in the pixel circuit area CCA due to the disposition of the demux area DMA, the fan-out area FOA, and the electrostatic discharge area ESA in the display area DA may be improved. For example, as shown in FIG. 5, the pixel circuits and the stages disposed in the second direction DR2 from the fourth pixel row PROW4 or the fifth pixel row PROW5 may be regularly arranged.

Accordingly, the number of lines (circuit rows) that may be inspected in auto optical inspection (AOI) that inspects a relative difference in a pattern unit including the same configuration may increase. Therefore, reliability of the display device and the tiled display device TD including the same may be improved.

Figure 8:
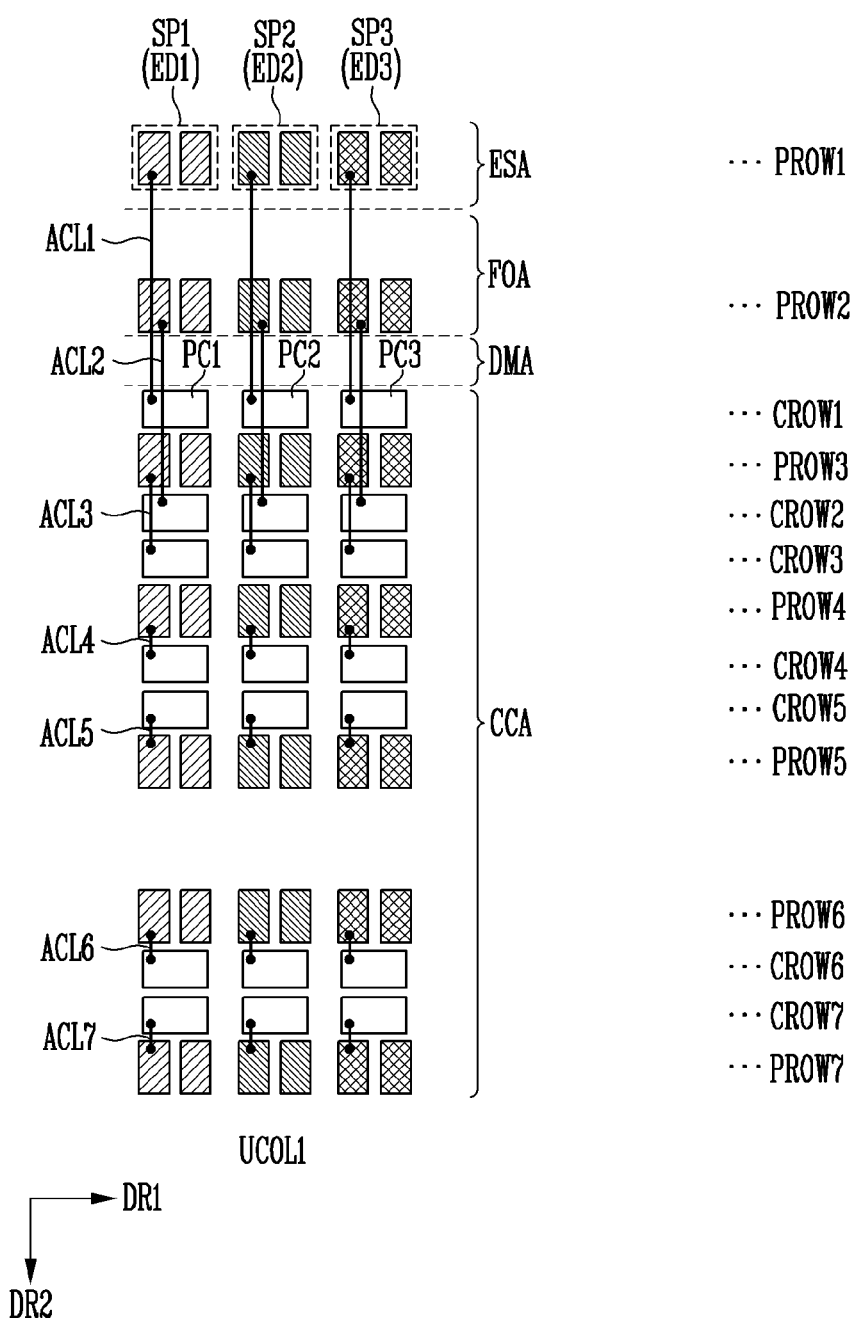
FIG. 8 is a schematic diagram illustrating an example of a connection relationship between a light emitting element and a pixel circuit in a first unit pixel column included in the display device of FIG. 5.

FIG. 8 is a schematic diagram illustrating an example of a connection relationship between the light emitting element and the pixel circuit in the first unit pixel column included in the display device of FIG. 5.

Referring to FIGS. 5 and 8, the first, second, and third pixel circuits PC1, PC2, and PC3 of the first unit pixel column UCOL1 may be electrically connected to the first, second, and third pixels SP1, SP2, and SP3 corresponding thereto, respectively.

The first, second, and third pixels SP1, SP2, and SP3 of the first pixel row PROW1 may be electrically connected to the first, second, and third pixel circuits PC1, PC2, and PC3 of the first circuit row CROW1, respectively. The first pixel SP1 (for example, the first pixel electrode ETL1 of the first pixel SP1) of the first pixel row PROWL may be electrically connected to the first pixel circuit PC1 of the first circuit row CROW1 through a first anode connection line ACL1. Similarly, the second pixel SP2 of the first pixel row PROW1 may be electrically connected to the second pixel circuit PC2 of the first circuit row CROW1 through an anode connection line. The third pixel SP3 of the first pixel row PROW1 may be electrically connected to the third pixel circuit PC3 of the first circuit row CROW1 through an anode connection line.

The first anode connection line ACL1 may extend in the second direction DR2. The first anode connection line ACL1 may extend from the pixel circuit area CCA to the electrostatic discharge area ESA. The first anode connection line ACL1 may overlap the second pixel row PROW2. The first anode connection line ACL1 may overlap the fan-out area FOA and the demux area DMA.

The first pixel SP1 (for example, the first pixel electrode ETL1 of the first pixel SP1) of the second pixel row PROW2 may be electrically connected to the first pixel circuit PC1 of the second circuit row CROW2 through a second anode connection line ACL2. Similarly, the second pixel SP2 of the second pixel row PROW2 may be electrically connected to the second pixel circuit PC2 of the second circuit row CROW2 through an anode connection line. The third pixel SP3 of the second pixel row PROW2 may be electrically connected to the third pixel circuit PC3 of the second circuit row CROW2 through an anode connection line.

The second anode connection line ACL2 may extend in the second direction DR2. The second anode connection line ACL2 may overlap the first circuit row CROW1 and the third pixel row PROW3. The second anode connection line ACL2 may overlap the demux area DMA.

The first pixel SP1 of the third pixel row PROW3 may be electrically connected to the first pixel circuit PC1 of the third circuit row CROW3 through a third anode connection line ACL3. Similarly, the second pixel SP2 and the third pixel SP3 of the third pixel row PROW3 may be electrically connected to the second pixel circuit PC2 and the third pixel circuit PC3 of the third circuit row CROW3, respectively, through a connection form similar to that of the third anode connection line ACL3.

The third anode connection line ACL3 may overlap the second circuit row CROW2.

The first pixel SP1 of the fourth pixel row PROW4 may be electrically connected to the first pixel circuit PC1 of the fourth circuit row CROW4 through a fourth anode connection line ACL4. Similarly, the second pixel SP2 and the third pixel SP3 of the fourth pixel row PROW4 may be electrically connected to the second pixel circuit PC2 and the third pixel circuit PC3 of the fourth circuit row CROW4, respectively, through a connection form similar to that of the fourth anode connection line ACL4.

The first pixel SP1 of the fifth pixel row PROW5 may be electrically connected to the first pixel circuit PC1 of the fifth circuit row CROW5 through a fifth anode connection line ACL5. The second pixel SP2 and the third pixel SP3 of the fifth pixel row PROW5 may be electrically connected to the second pixel circuit PC2 and the third pixel circuit PC3 of the fifth circuit row CROW5, respectively, through a connection form similar to that of the fifth anode connection line ACL5.

The first pixel SP1 of the sixth pixel row PROW6 may be electrically connected to the first pixel circuit PC1 of the sixth circuit row CROW6 through a sixth anode connection line ACL6. The second pixel SP2 and the third pixel SP3 of the sixth pixel row PROW6 may be electrically connected to the second pixel circuit PC2 and the third pixel circuit PC3 of the sixth circuit row CROW6, respectively, through a connection form similar to that of the sixth anode connection line ACL6.

The first pixel SP1 of the seventh pixel row PROW7 may be electrically connected to the first pixel circuit PC1 of the seventh circuit row CROW7 through a seventh anode connection line ACL7. The second pixel SP2 and the third pixel SP3 of the seventh pixel row PROW7 may be electrically connected to the second pixel circuit PC2 and the third pixel circuit PC3 of the seventh circuit row CROW7, respectively, through a connection form similar to that of the seventh anode connection line ACL7.

Figure 9:
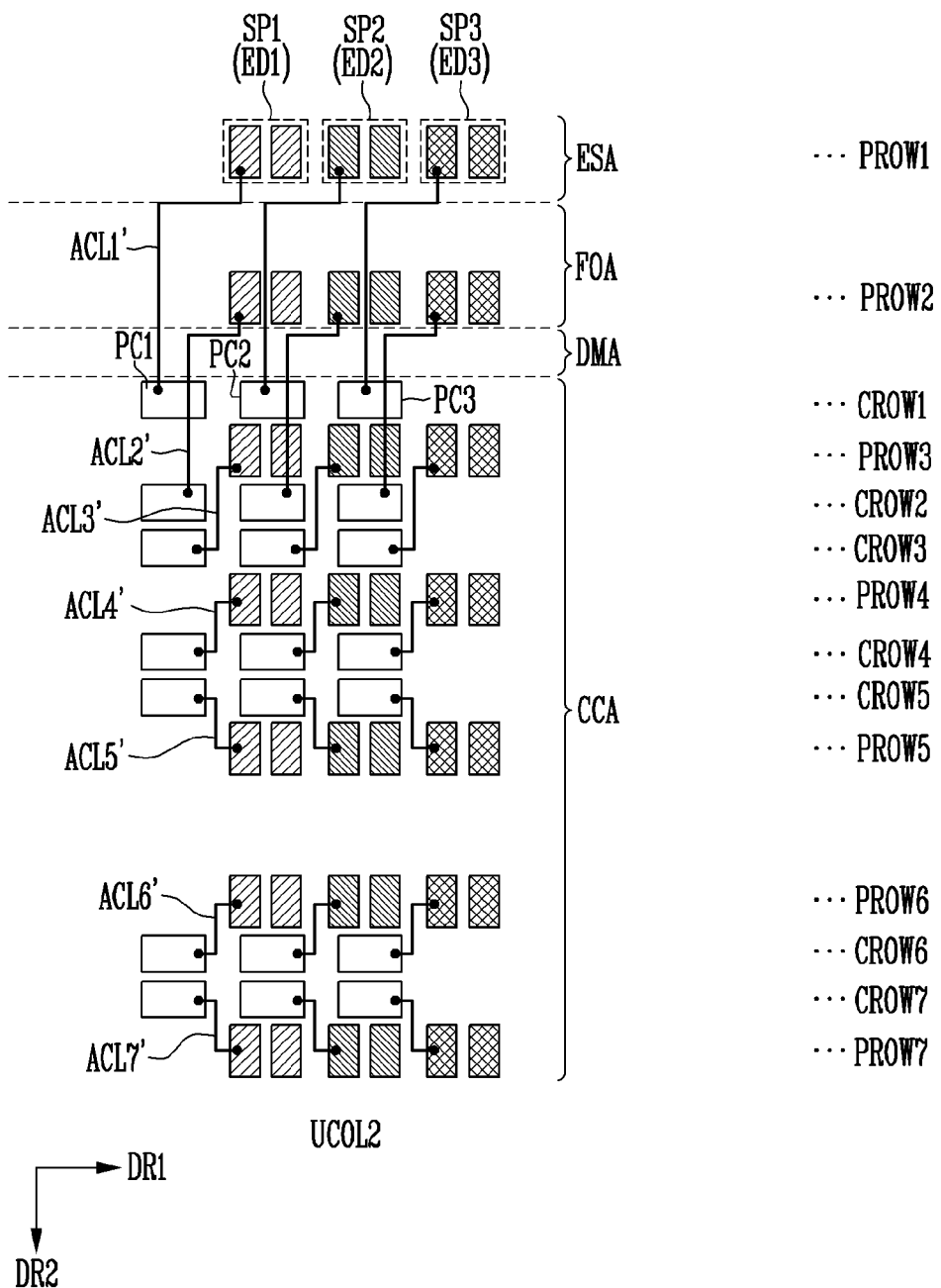
FIG. 9 is a schematic diagram illustrating an example of a connection relationship between a light emitting element and a pixel circuit in a second unit pixel column included in the display device of FIG. 5.

FIG. 9 is a schematic diagram illustrating an example of a connection relationship between the light emitting element and the pixel circuit in the second unit pixel column included in the display device of FIG. 5.

Referring to FIGS. 5 and 9, the first, second, and third pixel circuits PC1, PC2, and PC3 of the second unit pixel column UCOL2 may be electrically connected to the first, second, and third pixels SP1, SP2, and SP3 corresponding thereto, respectively.

In an embodiment, since the gate driver GDR is disposed adjacent to the second unit pixel column UCOL2, the first, second, and third pixel circuits PC1, PC2, and PC3 corresponding to the second unit pixel column UCOL2 may be shifted to one side or a side (for example, in a direction opposite to the first direction DR1) and may be disposed. For example, the first, second, and third pixel circuits PC1, PC2, and PC3 may be arranged to be shifted from the first, second, and third pixels SP1, SP2, and SP3 with respect to the second direction DR2.

In the second unit pixel column UCOL2, the first pixel SP1 of the first pixel row PROWL may be electrically connected to the first pixel circuit PC1 of the first circuit row CROW1 through a first anode connection line ACL1'.

In the second unit pixel column UCOL2, the first pixel SP1 of the second pixel row PROW2 may be electrically connected to the first pixel circuit PC1 of the second circuit row CROW2 through a second anode connection line ACL2'.

Similarly, in the second unit pixel column UCOL2, the first pixels SP1 of the third to seventh pixel rows PROW3 to PROW7 may be electrically connected to the third to seventh pixel rows CROW3 to CROW7 through third to seventh anode connection lines ACL3', ACL4', ACL5', ACL6', and ACL7', respectively.

Remaining anode connection lines may also connect the corresponding pixel circuit and the pixel similarly to the above description. Accordingly, a description repetitive to the above description is omitted.

Since the first, second, and third pixel circuits PC1, PC2, and PC3 are arranged to be shifted from the first, second, and third pixels SP1, SP2, and SP3 with respect to the second direction DR2, the first to seventh anode connection lines ACL1', ACL2', ACL3', ACL4', ACL5', ACL6', and ACL7' may include at least one bent portion and a portion extending in the first direction DR1.

Figure 10:
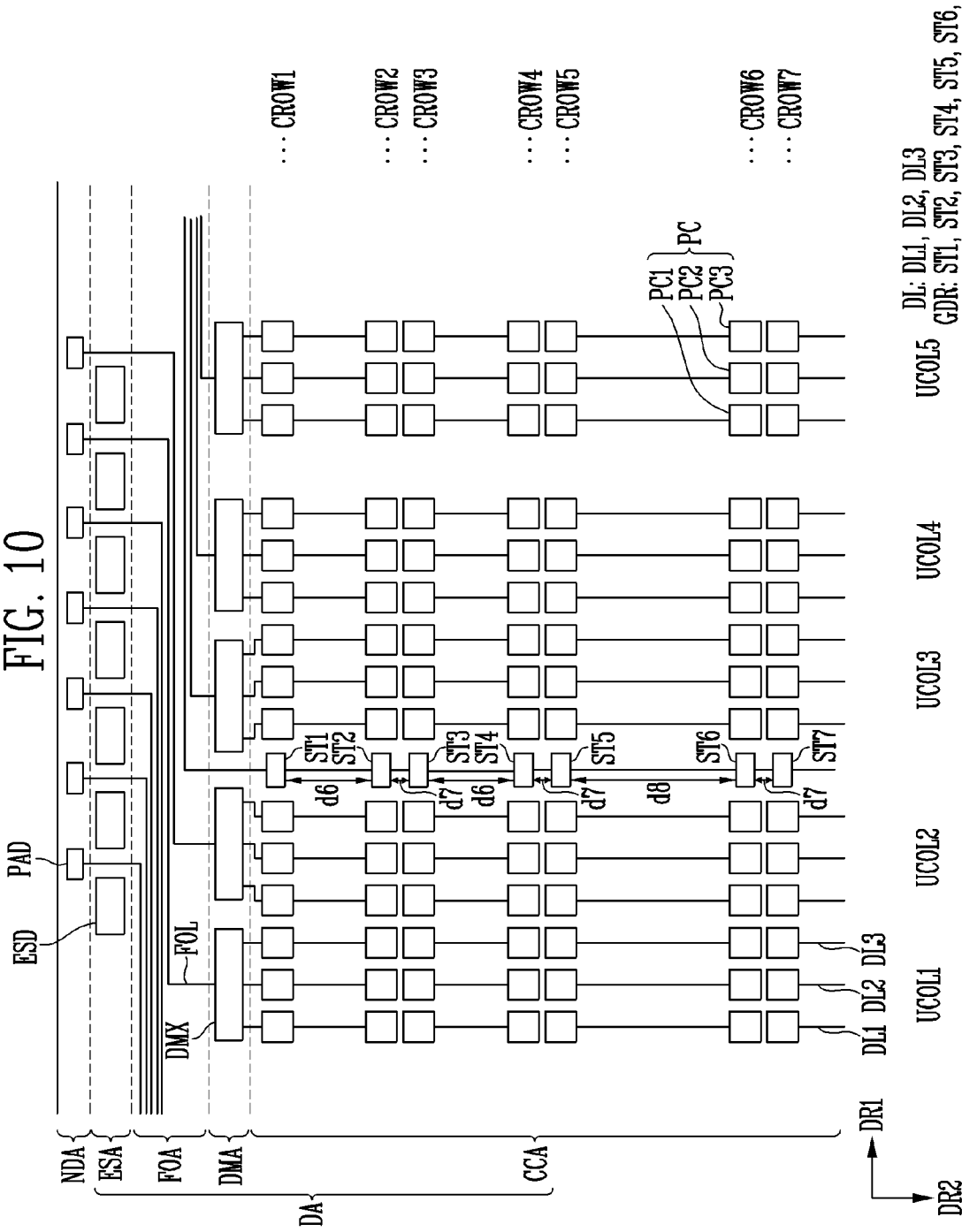
FIG. 10 is a schematic diagram illustrating an example of a pixel circuit area, a demux area, a fan-out area, an electrostatic discharge area, and a non-display area included in the display device of FIG. 5.

FIG. 10 is a schematic diagram illustrating an example of the pixel circuit area, the demux area, the fan-out area, the electrostatic discharge area, and the non-display area included in the display device of FIG. 5.

Referring to FIGS. 5, 6, 7, and 10, each of the display devices 10 may include the display area DA and the non-display area NDA. For convenience of description, pixel rows are omitted in FIG. 10.

The display area DA may include the electrostatic discharge area ESA, the fan-out area FOA, the demux area DMA, and the pixel circuit area CCA. In an embodiment, the electrostatic discharge area ESA, the fan-out area FOA, and the demux area DMA may be disposed at an edge of at least one side or a side of the display area DA. For example, the electrostatic discharge area ESA, the fan-out area FOA, and the demux area DMA may be disposed at an upper edge of the display area DA. As another example, the electrostatic discharge area ESA, the fan-out area FOA, and the demux area DMA may be disposed at left and right edges or upper and lower edges. As another example, at least one of the electrostatic discharge area ESA, the fan-out area FOA, and the demux area DMA may be disposed on at least one edge or an edge of the display device 10. The non-display area NDA may include pad portions PAD.

The electrostatic discharge area ESA may include electrostatic discharge circuits ESD. In an embodiment, the electrostatic discharge circuit ESD may overlap at least a portion of the first, second, and third pixels SP1, SP2, and SP3 of the first pixel row PROW1.

The electrostatic discharge circuit ESD may protect the fan-out line FOL, the demux DMX, and the pixel circuit PC from static electricity. The electrostatic discharge circuit ESD may discharge static electricity introduced from the outside to prevent static electricity from flowing into the display area DA.

The fan-out area FOA may include fan-out lines FOL. The fan-out lines FOL may overlap the first, second, and third pixels SP1, SP2, and SP3 of the second pixel row PROW2.

In an embodiment, the fan-out line FOL may extend from the pad portion PAD to the demux DMX. The fan-out line FOL may supply the data voltage (the data signal) received from the pad portion PAD to the demux DMX.

In an embodiment, the fan-out line FOL may extend from the pad portion PAD to the pixel circuit area CCA. The fan-out line FOL may supply a clock signal received from the pad portion PAD to a clock line driving the gate driver GDR, and supply a power voltage or a control voltage received from the pad portion PAD to a voltage line driving the data driver GDR.

The demux area DMA may include demuxes DMX. The demux DMX may supply the data voltage received from the fan-out line FOL to first, second, and third data lines DL1, DL2, and DL3 in a time division method. As each of the display devices 10 may include the demux DMX, the number of fan-out lines FOL may be reduced and the area of the fan-out area FOA may be reduced.

The pixel circuit area CCA may include a data line DL. Although not shown, the pixel circuit area CCA may further include gate lines for driving the pixel circuit PC, clock lines, voltage lines, and carry lines for driving the gate driver GDR, and the like within the spirit and the scope of the disclosure.

The data line DL may be connected between the demux DMX and the pixel circuit PC. The data lines DL may extend in the second direction DR2 and may be spaced apart from each other in the first direction DR1. The data line DL may supply the data voltage received from the demux DMX to the pixel circuit PC. The data line DL may include the first, second, and third data lines DL1, DL2, and DL3.

The first data line DL1 may be connected to the first pixel circuits PC1 of each unit pixel column (for example, the first unit pixel column UCOL1). The first data line DL1 may sequentially supply the data voltage to the first pixel circuits PC1 disposed in each unit pixel column.

The second data line DL2 may be connected to the second pixel circuits PC2 of each unit pixel column (for example, the first unit pixel column UCOL1). The second data line DL2 may sequentially supply the data voltage to the second pixel circuits PC2 disposed in each unit pixel column.

The third data line DL3 may be connected to the third pixel circuits PC3 of each unit pixel column (for example, the first unit pixel column UCOL1). The third data line DL3 may sequentially supply the data voltage to the third pixel circuits PC3 disposed in each unit pixel column.

The gate driver GDR may be disposed between adjacent unit pixel columns of the pixel circuit area CCA. In an embodiment, the gate driver GDR may include the stages ST1 to ST7 disposed between the second unit pixel column UCOL2 and the third unit pixel column UCOL3. However, this is an example, and positions at which the stages ST1 to ST7 are disposed are not limited thereto. For example, the stages ST1 to ST7 may be disposed between the first unit pixel column UCOL1 and the second unit pixel column UCOL2, or between the third unit pixel column UCOL3 and the fourth unit pixel column UCOL4. Other stages outputting a gate signal (a scan signal or the like) different from that of the stages ST1 to ST7 may be further disposed between different pixel columns.

The first to seventh stages ST1 to ST7 may be disposed in the first to seventh circuit rows CROW1 to CROW7, respectively. The first to seventh stages ST1 to ST7 may be arranged along the second direction DR2.

The first stage ST1 may supply the gate signal to the gate line disposed in the first circuit row CROW1. The second stage ST2 may supply the gate signal to the gate line disposed in the second circuit row CROW2. Similarly, the third to seventh stages ST3 to ST7 may supply the gate signals to the gate lines disposed in the third to seventh circuit rows CROW3 to CROW5, respectively.

A distance of the second direction DR2 between adjacent stages may be determined according to an arrangement position of the circuit rows (for example, CROW1 to CROW7) described above. In an embodiment, since the third pixel row PROW3 is disposed between the first circuit row CROW1 and the second circuit row CROW2, a distance of the second direction DR2 between the first stage ST1 and the second stage ST2 may be set as a sixth distance d6.

The second circuit row CROW2 and the third circuit row CROW3 may be adjacent to each other, and a distance of second direction DR2 between the second stage ST2 and the third stage ST3 may be set as a seventh distance d7. The seventh distance d7 may be less than the sixth distance d6.

The fourth pixel row PROW4 may be disposed between the third circuit row CROW3 and the fourth circuit row CROW4, and a distance of the second direction DR2 between the third stage ST3 and the fourth stage ST4 may be set as the sixth distance d6.

The fourth circuit row CROW4 and the fifth circuit row CROW5 may be adjacent to each other, and a distance of the second direction DR2 between the fourth stage ST4 and the fifth stage ST5 may be the seventh distance d7.

The fifth pixel row PROW5 and the sixth pixel row PROW6 may be disposed between the fifth circuit row CROW5 and the sixth circuit row CROW6. An additional space may be further inserted between the fifth pixel row PROW5 and the sixth pixel row PROW6 so that a distance between the fifth pixel row PROW5 and the sixth pixel row PROW6 is equal to a distance between other adjacent pixel rows (for example, the fourth pixel row PROW4 and the fifth pixel row PROW5). Therefore, the distance of the second direction DR2 between the fifth stage ST5 and the sixth stage ST6 may be set as an eighth distance d8. The eighth distance d8 may be greater than the sixth distance d6.

The sixth circuit row CROW6 and the seventh circuit row CROW7 may be adjacent to each other, and a distance of the second direction DR2 between the sixth stage ST6 and the seventh stage ST7 may be the seventh distance d7.

The eighth stage may be disposed at the eighth distance d8 from the seventh stage ST7. For example, an arrangement of stages after the seventh stage ST7 may have a form in which the eighth distance d8 and the seventh distance d7 may be alternately repeated.

Accordingly, a circuit arrangement of an area including the second and third unit pixel columns UCOL2 and UCOL3 may have a regular pattern from the fourth circuit row CROW4. Therefore, the number of circuit rows that may be inspected in case that the AOI is performed on an irregular circuit row arrangement of an upper portion of the display area DA may increase.

Figure 11:
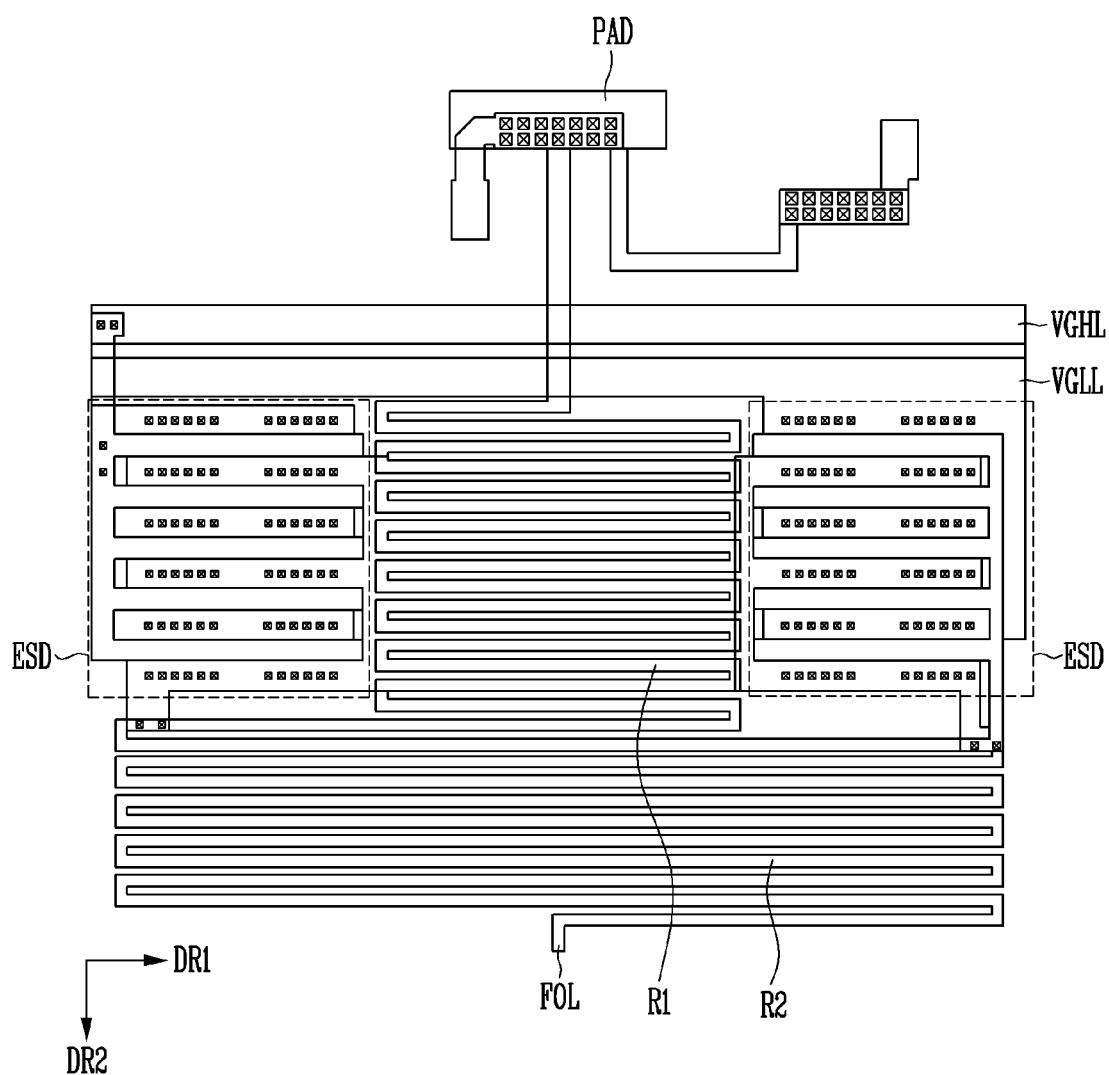
FIG. 11 is an enlarged view illustrating an example of a portion of the electrostatic discharge area and the fan-out area of FIG. 10.

FIG. 11 is an enlarged view illustrating an example of a portion of the electrostatic discharge area and the fan-out area of FIG. 10.

Referring to FIGS. 10 and 11, the fan-out line FOL connected to the pad portion PAD may include a first line resistor R1 and a second line resistor R2. In an embodiment, each of the first and second line resistors R1 and R2 may be formed in a zigzag pattern.

Lengths of each of the first and second line resistors R1 and R2 may be designed differently according to a position of the fan-out line FOL. For example, the fan-out lines FOL may have substantially the same resistance value by adjusting each of the lengths of the first and second line resistors R1 and R2 of the fan-out lines FOL.

The electrostatic discharge circuit ESD may be disposed adjacent to the fan-out line FOL. Some or a number of the electrostatic discharge circuits ESD may be connected between the fan-out line FOL and a gate-off voltage line VGHL, and others of the electrostatic discharge circuits ESD may be connected between the fan-out line FOL and a gate-on voltage line VGLL.

The gate-off voltage line VGHL may be a signal line that transmits a gate-off voltage that turns off a transistor included in the display area DA. The gate-on voltage line VGLL may be a signal line that transmits a gate-on voltage that turns on the transistor included in the display area DA. In case that the gate-off voltage is a logic high level, the gate-on voltage may be a logic low level. Conversely, in case that the gate-off voltage is a logic low level, the gate-on voltage may be a logic high level.

The electrostatic discharge circuit ESD may be connected to a portion between the first and second line resistors R1 and R2 of the fan-out line FOL, but is not limited thereto. The electrostatic discharge circuit ESD may discharge static electricity introduced from the outside to prevent the static electricity from flowing into the display area DA.

Figure 12:
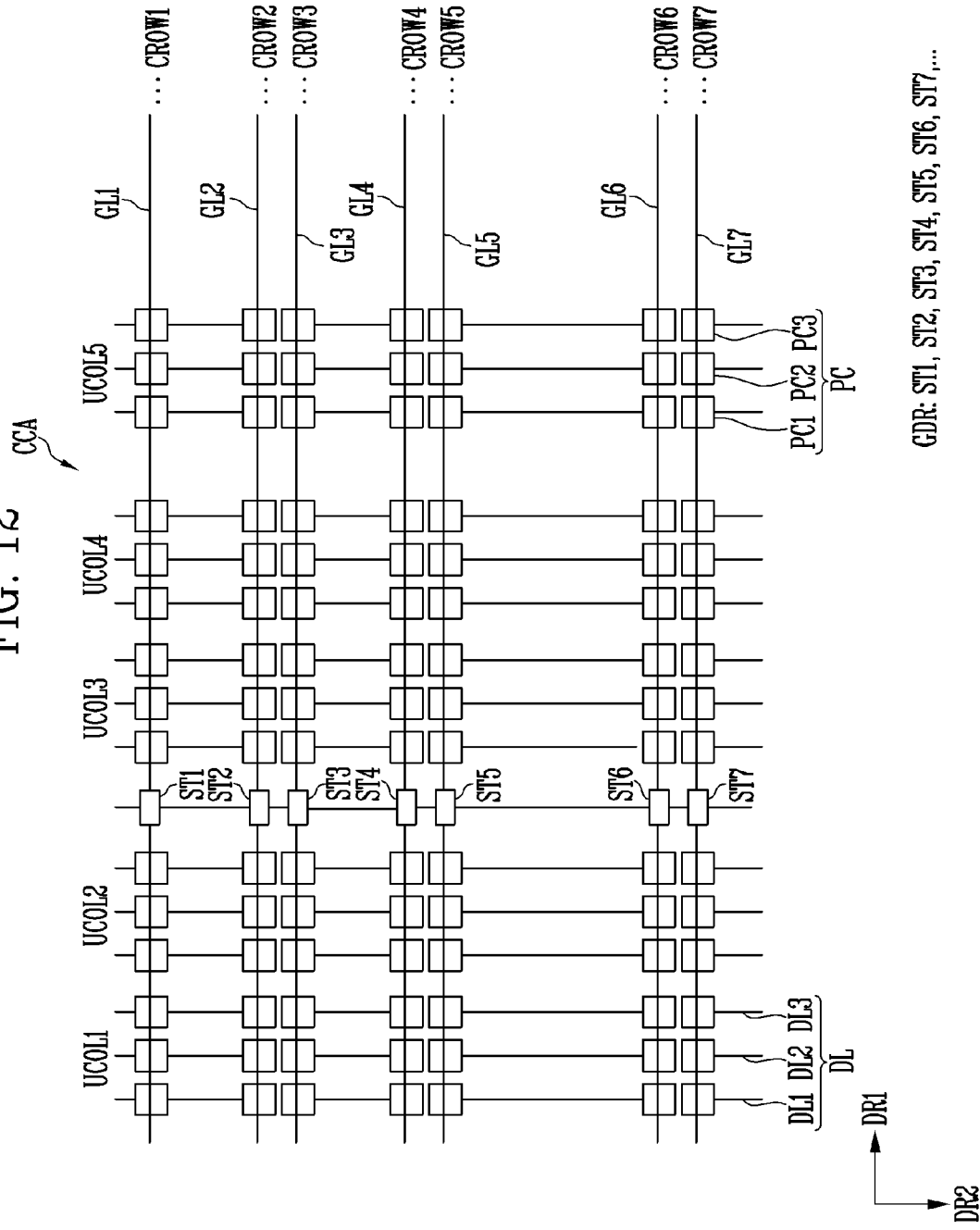
FIG. 12 is a schematic diagram illustrating an example of stages and gate lines included in the display device of FIG. 5.

FIG. 12 is a schematic diagram illustrating an example of the stages and the gate lines included in the display device of FIG. 5.

Referring to FIGS. 5, 10, and 12, the gate driver GDR may be disposed in the pixel circuit area CCA.

The gate driver GDR may supply the gate signal to gate lines GL1 to GL7 connected to the pixel circuits PC. The gate driver GDR may include the stages ST1 to ST7 that supply the gate signal to the pixel circuits PC of each of the circuit rows CROW1 to CROW7.

The first to seventh stages ST1 to ST7 may be disposed in the first to seventh circuit rows CROW1 to CROW7, respectively. For example, the first stage ST1 may be disposed in a space provided by respectively shifting the pixel circuit PC corresponding to the second unit pixel column UCOL2 of the first circuit row CROW1 and the pixel circuit PC corresponding to the third unit pixel column UCOL3 of the first circuit row CROW1 in opposite directions.

Accordingly, a distance of the first direction DR1 between the pixel circuit PC corresponding to the second unit pixel column UCOL2 and the pixel circuit PC corresponding to the third unit pixel column UCOL3 may be greater than a distance of the first direction DR1 between the pixel circuit PC corresponding to the first unit pixel column UCOL1 and the pixel circuit PC corresponding to the second unit pixel column UCOL2.

In an embodiment, the first stage ST1 may be connected to the first gate line GL1 extending in the first direction DR1 and a direction opposite to the first direction DR1. The first gate line GL1 may be connected to each of the pixel circuits PC of the first circuit row CROW1.

The second stage ST2 may be connected to the second gate line GL2 extending in the first direction DR1 and a direction opposite to the first direction DR1. The second gate line GL2 may be connected to each of the pixel circuits PC of the second circuit row CROW2.

The third stage ST3 may be connected to the third gate line GL3 extending in the first direction DR1 and a direction opposite to the first direction DR1. The third gate line GL3 may be connected to each of the pixel circuits PC of the third circuit row CROW3.

The fourth to seventh stages ST4 to ST7 may be respectively connected to the fourth to seventh gate lines GL4 to GL7. The fourth to seventh gate lines GL4 to GL7 may be connected to the pixel circuits PC of the fourth to seventh circuit rows CROW4 to CROW7, respectively.

Figure 13:
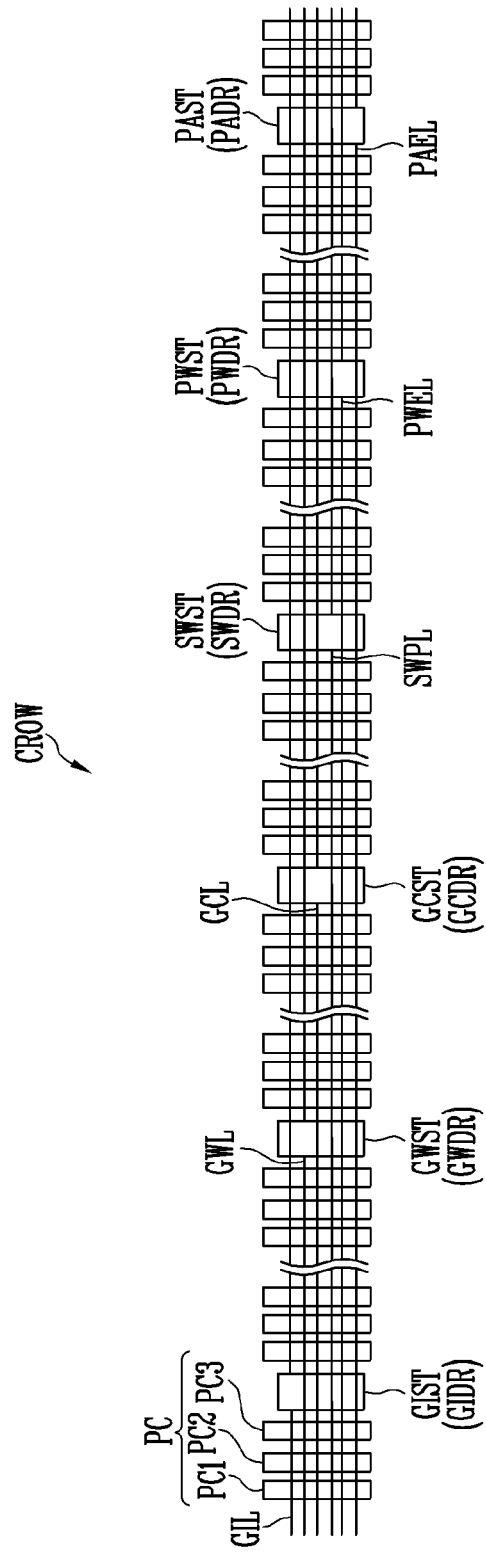
FIG. 13 is a schematic diagram illustrating an example of stages and gate lines connected to a pixel row included in the display device of FIG. 5.

FIG. 13 is a schematic diagram illustrating an example of stages and gate lines connected to one pixel row included in the display device of FIG. 5.

Referring to FIGS. 5, 10, and 13, the gate driver GDR may include drivers outputting different gate signals. Each of the drivers may include stages.

In an embodiment, the stages of the different drivers may be disposed between different unit pixel columns. FIG. 13 shows stages and gate lines corresponding to one circuit row and pixel circuits PC for convenience of description. It may be understood that a disposition relationship of FIG. 13 is extended and/or applied to other circuit rows.

In an embodiment, the gate driver GDR may include an initialization scan driver GIDR, a write scan driver GWDR, a control scan driver GCDR, a sweep driver SWDR, a PWM emission driver PWDR, and a PAM emission driver PADR.

The initialization scan driver GIDR may include an initialization scan stage GIST. The write scan driver GWDR may include a write scan stage GWST. The control scan driver GCDR may include a control scan stage GCST. The sweep driver SWDR may include a sweep stage SWST. The PWM emission driver PWDR may include a PWM stage PWST. The PAM emission driver PADR may include a PAM stage PAST.

In an embodiment, the initialization scan stage GIST, the write scan stage GWST, the control scan stage GCST, the sweep stage SWST, the PWM stage PWST, and the PAM stage PAST may be disposed in a same circuit row CROW. The initialization scan stage GIST, the write scan stage GWST, the control scan stage GCST, the sweep stage SWST, the PWM stage PWST, and the PAM stage PAST may be disposed between different unit pixel columns. For example, the pixel circuits PC (for example, at least three pixel circuits) corresponding to at least three unit pixel columns may be disposed between the initialization scan stage GIST and the write scan stage GWST.

In an embodiment, the gate line GL may include an initialization scan line GIL, a write scan line GWL, a control scan line GCL, a sweep signal line SWPL, a PAM emission control line PAEL, and a PWM emission control line PWEL. For example, the first gate line GL1 of FIG. 12 may include a first initialization scan line, a first write scan line, a first control scan line, a first sweep signal line, a first PAM emission control line, and a first PWM emission control line.

The initialization scan stage GIST may provide an initialization scan signal to the pixel circuits PC of the circuit row CROW through the initialization scan line GIL.

The write scan stage GWST may provide a write scan signal to the pixel circuits PC of the circuit row CROW through the write scan line GWL.

The control scan stage GCST may provide a control scan signal to the pixel circuits PC of the circuit row CROW through the control scan line GCL.

The sweep stage SWST may provide a sweep signal to the pixel circuits PC of the circuit row CROW through the sweep signal line SWPL.

The PWM stage PWST may provide a PWM emission control signal to the pixel circuits PC of the circuit row CROW through the PWM emission control line PWEL.

The PAM stage PAST may provide a PAM emission control signal to the pixel circuits PC of the circuit row CROW through the PAM emission control line PAEL.

Figure 14:
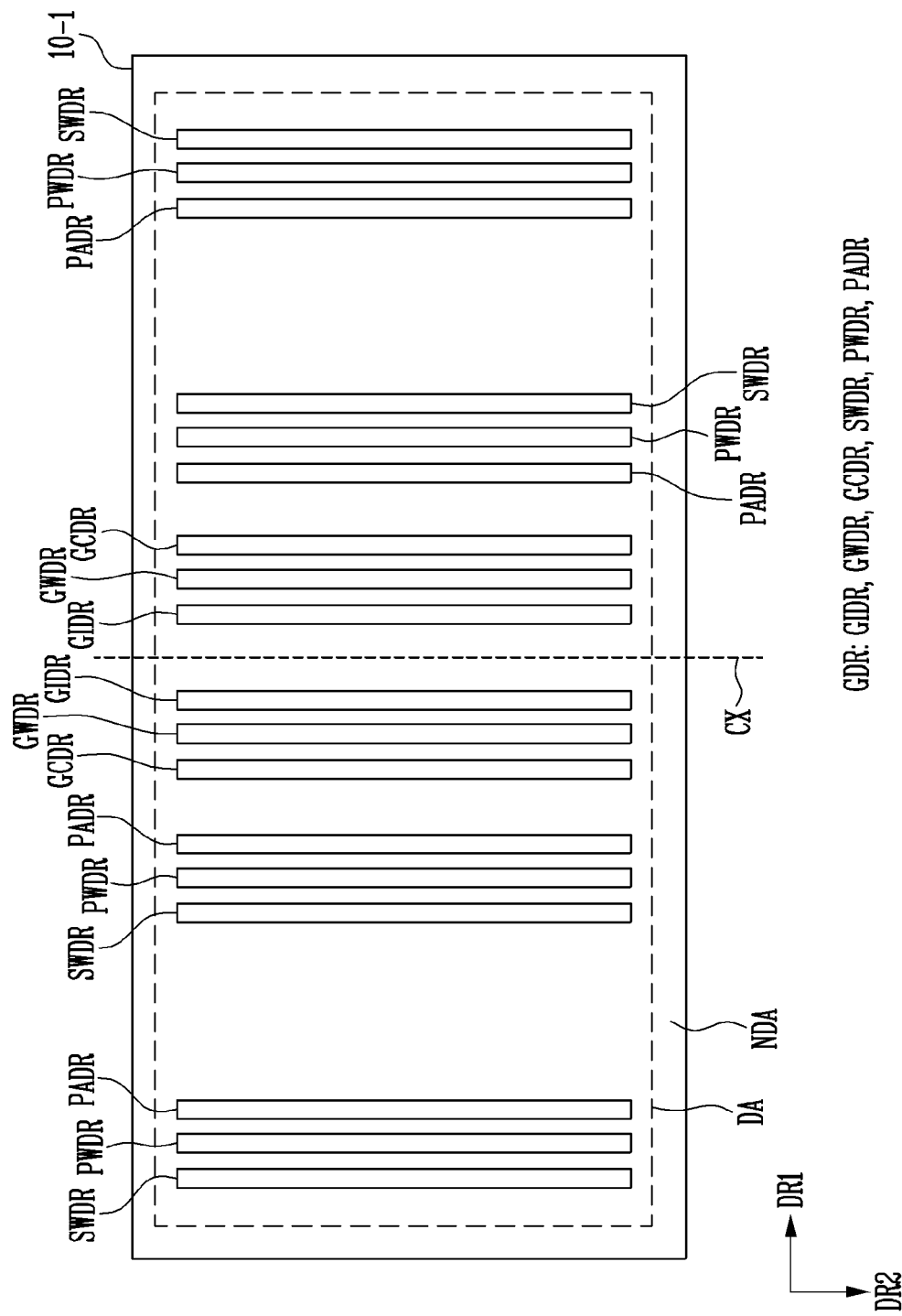
FIG. 14 is a schematic diagram illustrating an example of a disposition of a gate driver included in the display device of FIG. 5.

FIG. 14 is a schematic diagram illustrating an example of a disposition of the gate driver included in the display device of FIG. 5.

Referring to FIGS. 5, 12, 13, and 14, the gate driver GDR may be disposed in the display area DA of the first display device 10-1.

As described with reference to FIGS. 5, 12, and 13, the gate driver GDR may include the stages inserted into the circuit rows.

In an embodiment, the gate driver GDR may include the initialization scan driver GIDR, the write scan driver GWDR, the control scan driver GCDR, the sweep driver SWDR, the PWM emission driver PWDR, and the PAM emission driver PADR. In an embodiment, each of the initialization scan driver GIDR, the write scan driver GWDR, the control scan driver GCDR, the sweep driver SWDR, the PWM emission driver PWDR, and the PAM emission driver PADR may be formed of columns.

For example, stages of the same initialization scan driver GIDR may be symmetrically disposed with respect to a virtual central axis CX of the display area DA. The initialization scan drivers GIDR on left and right sides with respect to the central axis CX may be driven substantially identically (may output the same signal).

Similarly, stages of the same write scan driver GWDR may be symmetrically disposed with respect to the central axis CX. Stages of the same control scan driver GCDR may be symmetrically disposed with respect to the central axis CX.

Stages of the same sweep driver SWDR may be symmetrically disposed with respect to the central axis CX. Stages of the same PWM emission driver PWDR may be symmetrically disposed with respect to the central axis CX. Stages of the same PAM emission driver PADR may be symmetrically disposed with respect to the central axis CX.

Accordingly, RC delay, signal distortion, or the like of signals supplied from the gate driver GDR in a horizontal direction (for example, a direction parallel to the first direction DR1) may be improved.

In an embodiment, each of the sweep driver SWDR, the PWM emission driver PWDR, and the PAM emission driver PADR may include four columns of stages. For example, two columns of stages may be disposed on the left side of the central axis CX, and two columns of stages may be disposed on the right side of the central axis CX symmetrically thereto.

However, this is an example, and positions of each of the initialization scan driver GIDR, the write scan driver GWDR, the control scan driver GCDR, the sweep driver SWDR, the PWM emission driver PWDR, and the PAM emission driver PADR, and the number of columns in which the stages are disposed are not limited thereto. A disposition of the initialization scan driver GIDR, the write scan driver GWDR, the control scan driver GCDR, the sweep driver SWDR, the PWM emission driver PWDR, and the PAM emission driver PADR may be designed to minimize signal distortion and/or loss.

Figure 15A:
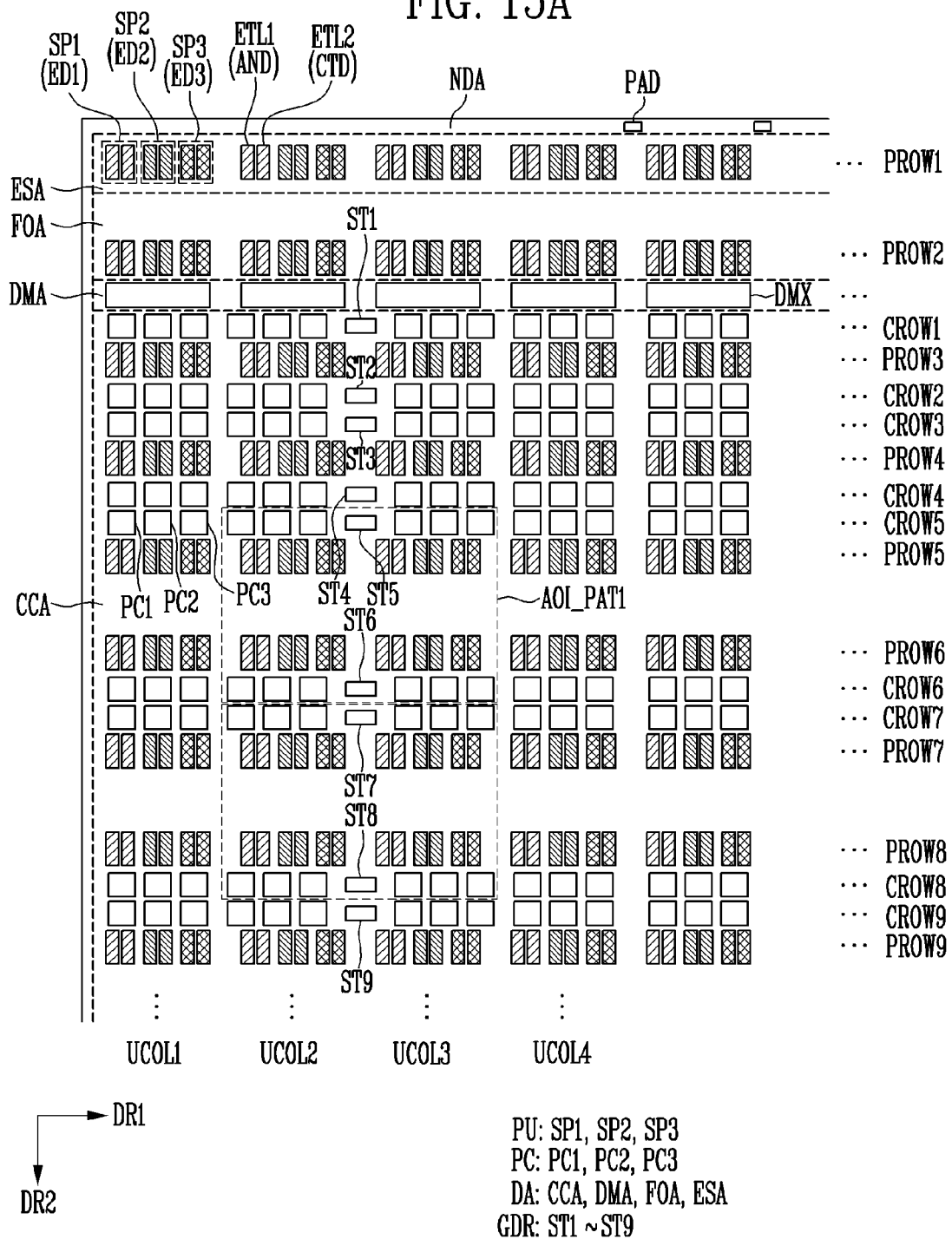
FIG. 15A is a schematic diagram illustrating an example of an inspection pattern for an auto optical inspection on the display device of FIG. 5.

FIG. 15A is a schematic diagram illustrating an example of an inspection pattern for the AOI on the display device of FIG. 5.

Referring to FIGS. 5 and 15A, the AOI may be performed on the pixel circuit area CCA in a preset pattern unit.

The AOI may set an area including two horizontal pixels (a configuration including a light emitting element and a pixel circuit) and two vertical pixels (a configuration including a light emitting element and a pixel circuit) as an inspection pattern AOI_PAT1. For example, the inspection pattern AOI_PAT1 may include pixels of 2 rows×2 columns.

The AOI may repeatedly inspect whether a difference between the inspection patterns AOI_PAT1 in a corresponding column exists while moving the inspection pattern AOI_PAT1 in the second direction DR2 by a vertical width of the inspection pattern AOI_PAT1. Through this, a defect (short/open, a slit, a pinhole, a residue, a foreign material, or the like) that may occur in a patterning unit process such as a photo process and an etching process may be detected.

As a condition for the AOI, a structure of an area corresponding to the inspection pattern AOI_PAT1 is required to be substantially the same.

In a display device design of the related art, stages may be formed in an empty space between pixel rows. For example, the stages are formed after the fifth pixel row PROW5, and are formed in a space between the fifth pixel row PROW5 and the sixth pixel row PROW6, and a space between the seventh pixel row PROW7 and the eighth pixel row PROW5. Accordingly, a regularity of a pixel circuit area of the related art is required to start from a thirteenth circuit row, and the AOI on first to twelfth circuit rows is impossible.

However, in the display devices 10 according to embodiment of the disclosure, the stages ST1 to ST9 are inserted into each of the circuit rows CROW1 to CROW9, and thus circuits may be regularly disposed from the fourth pixel row PROW4 in a direction downwardly from the fourth pixel row PROW4. In case that all pixel rows and circuit rows are set to an even number, the inspection pattern AOI_PAT1 starting from the fifth circuit row CROW5 may be set as shown in FIG. 15A.

Accordingly, the number of lines (circuit rows and pixel rows) on which the AOI may be performed may increase. Therefore, reliability of the display device and the tiled display device TD including the same may be improved.

Figure 15B:
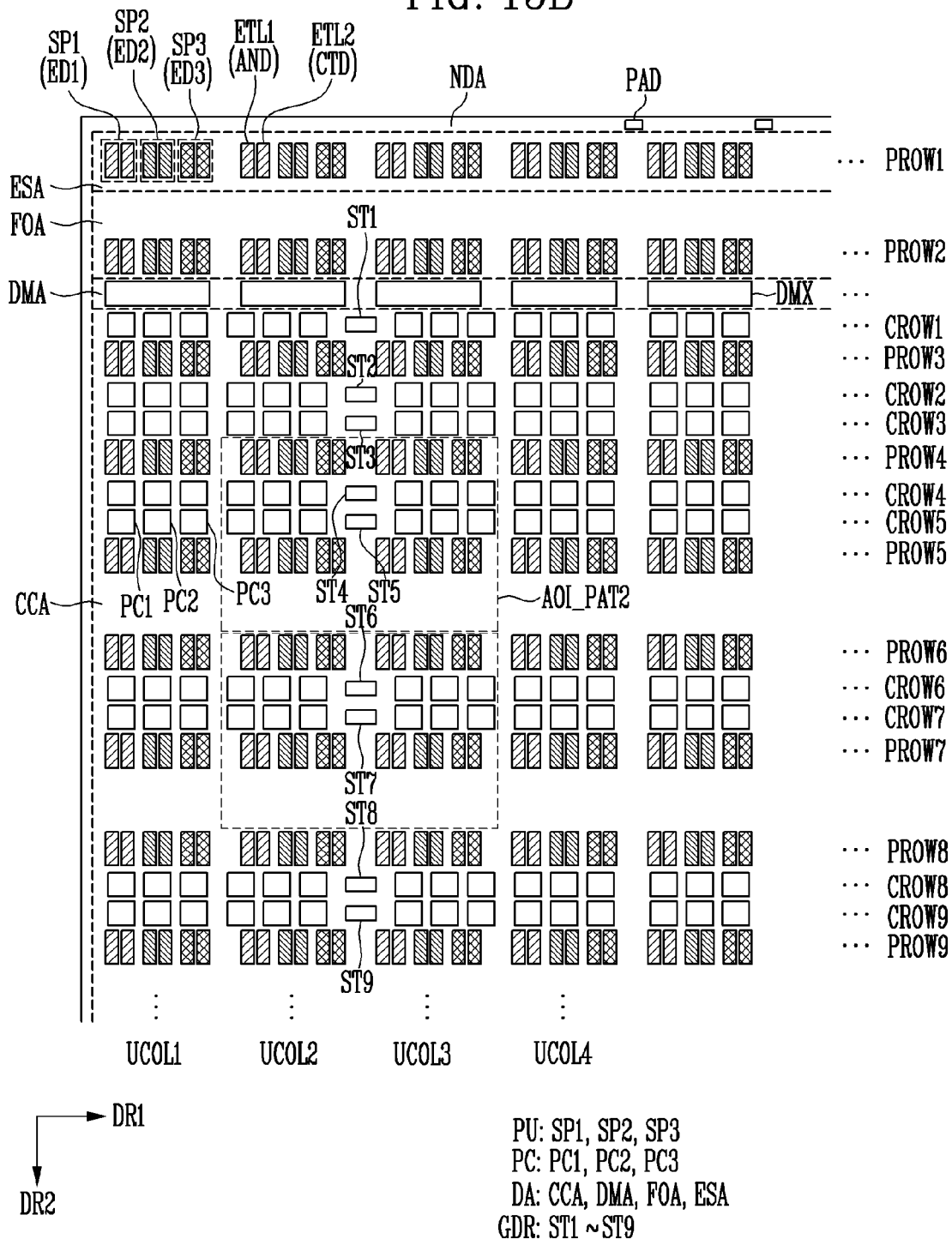
FIG. 15B is a schematic diagram illustrating an example of the inspection pattern for the auto optical inspection of the display device of FIG. 5.

FIG. 15B is a schematic diagram illustrating an example of the inspection pattern for the auto optical inspection of the display device of FIG. 5.

Referring to FIGS. 5 and 15B, the AOI may be performed on the pixel circuit area CCA in a preset pattern unit.

An inspection pattern AOI_PAT2 may be set as an area including pixels of 2 rows×2 columns. In an embodiment, in case that all pixel rows and circuit rows are set to an even number, the inspection pattern AOI_PAT2 may be set to start from the fourth circuit row CROW4 as shown in FIG. 15B.

Figure 16:
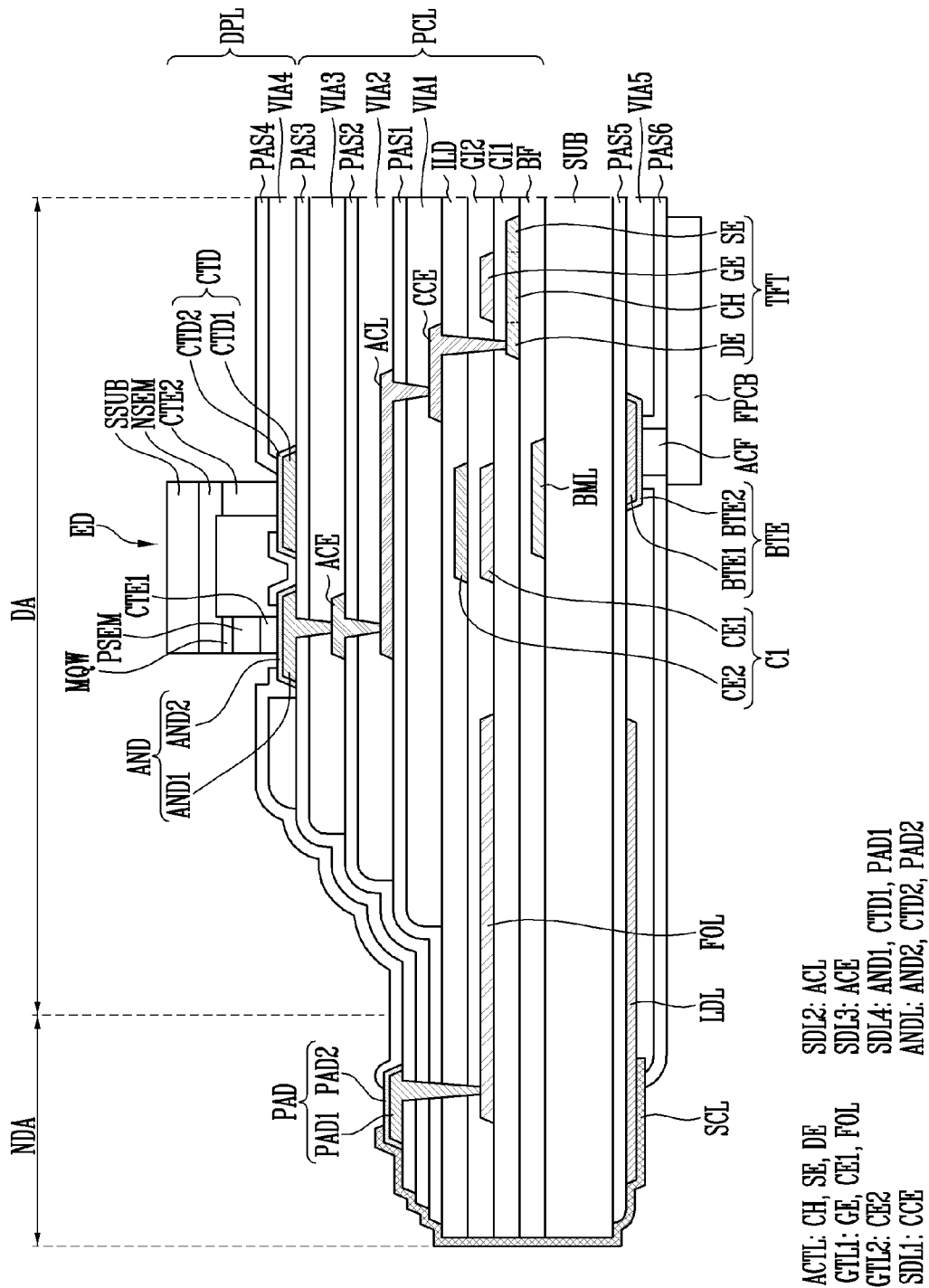
FIG. 16 is a schematic cross-sectional view illustrating an example of the display device of FIG. 5.

FIG. 16 is a schematic cross-sectional view illustrating an example of the display device of FIG. 5.

Referring to FIG. 16, each of the display devices 10 may include a substrate SUB, a pixel circuit layer PCL, and a display element layer DPL.

A stack structure may be formed on each of a front surface and a rear surface of the substrate SUB. For example, the pixel circuit layer PCL and the display element layer DPL may be disposed on the front surface of the substrate SUB.

The pixel circuit layer PCL may include a light blocking layer BML, a buffer layer BF, an active layer ACTL, a first gate insulating layer GI1, a first gate layer GTL1, a second gate insulating layer GI2, a second gate layer GTL2, an interlayer insulating layer ILD, a first source metal layer SDL1, a first via layer VIA1, a first protective layer PAS1, a second source metal layer SDL2, a second via layer VIA2, a second protective layer PAS2, a third source metal layer SDL3, a third via layer VIA3, and a third protective layer PAS3.

The display element layer DPL may include a fourth source metal layer SDL4, an anode layer ANDL, a fourth via layer VIA4, and a fourth protective layer PAS4.

A fifth protective layer PAS5, a rear surface electrode BTE, a lead line LDL, a fifth via layer VIA5, a sixth protective layer PAS6, and a flexible film FPCB may be disposed on the rear surface of the substrate SUB.

A side surface connection line SCL electrically connecting the front surface and the rear surface of the substrate SUB may be disposed across a side surface of the substrate SUB.

The substrate SUB may support each of the display devices 10. The substrate SUB may be a base substrate or a base member. The substrate SUB may be a flexible substrate capable of bending, folding, rolling, or the like within the spirit and the scope of the disclosure. For example, the substrate SUB may include an insulating material such as a polymer resin such as polyimide (PI), but is not limited thereto. As another example, the substrate SUB may be a rigid substrate including a glass material.

The light blocking layer BML may be disposed on the substrate SUB. The light blocking layer BML may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

In an embodiment, the light blocking layer BML may be connected to one electrode (for example, a source electrode) of a transistor TFT (for example, a driving transistor). By way of example, the light blocking layer BML may overlap at least a portion of the active layer ACTL of the transistor TFT, and block light incident to the active layer ACTL, thereby stabilizing an operation characteristic of the transistor TFT.

The buffer layer BF may be disposed on the substrate SUB. The buffer layer BF may include an inorganic material capable of preventing penetration of air or moisture. The buffer layer BF may include inorganic layers alternately stacked each other. For example, the buffer layer BF may be multiple layers in which one or more inorganic layers of a silicon nitride layer, a silicon oxynitride layer, a silicon oxide layer, a titanium oxide layer, and an aluminum oxide layer may be alternately stacked each other.

The active layer ACTL may be disposed on the buffer layer BF. The active layer ACTL may include a channel CH, a source electrode SE, and a drain electrode DE of the transistor TFT. Here, the transistor TFT may be a transistor configuring the pixel circuit PC. The source electrode SE and the drain electrode DE may become conductive by heat-treating the active layer ACTL. For example, the active layer ACTL may include polycrystalline silicon, single crystal silicon, low-temperature polycrystalline silicon, amorphous silicon, or an oxide semiconductor. As another example, the active layer ACTL may include first and second active layers disposed on different layers. The first active layer may include polycrystalline silicon, single crystal silicon, low-temperature polycrystalline silicon, or amorphous silicon, and the second active layer may include an oxide semiconductor.

The first gate insulating layer GI1 may be disposed on the active layer ACTL. The first gate insulating layer GI1 may insulate a gate electrode GE and the channel CH of the transistor TFT. The first gate insulating layer GI1 may include an inorganic layer. For example, the first gate insulating layer GI1 may include one of a silicon nitride layer, a silicon oxynitride layer, a silicon oxide layer, a titanium oxide layer, and an aluminum oxide layer.

The first gate layer GTL1 may be disposed on the first gate insulating layer GI1. The first gate layer GTL1 may include the fan-out line FOL, the gate electrode GE of the transistor TFT, and a first capacitor electrode CE1 (for example, a lower electrode) of a first capacitor C1 (refer to FIG. 21). The first gate layer GTL1 may be a single layer or multiple layers formed of any one of molybdenum (Mo), aluminum (Al), chromium (Cr), gold (Au), titanium (Ti), nickel (Ni), neodymium (Nd), and copper Cu, or an alloy thereof.

The fan-out line FOL may be connected to the pad portion PAD passing through the first to third protective layers PAS1, PAS2, and PAS3, the interlayer insulating layer ILD, and the second gate insulating layer GI2. The fan-out line FOL may extend from the pad portion PAD to the display area DA, thereby reducing the size of the non-display area NDA.

The second gate insulating layer GI2 may be disposed on the first gate layer GTL1. The second gate insulating layer GI2 may insulate the first gate layer GTL1 and the second gate layer GTL2. The second gate insulating layer GI2 may include an inorganic layer. For example, the second gate insulating layer GI2 may include one of a silicon nitride layer, a silicon oxynitride layer, a silicon oxide layer, a titanium oxide layer, and an aluminum oxide layer.

The second gate layer GTL2 may be disposed on the second gate insulating layer GI2. The second gate layer GTL2 may include the first capacitor electrode CE1 of the first capacitor C1. The second gate layer GTL2 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The interlayer insulating layer ILD may be disposed on the second gate layer GTL2. The interlayer insulating layer ILD may insulate the first source metal layer SDL1 and the second gate layer GTL2. The interlayer insulating layer ILD may include an inorganic layer. For example, the interlayer insulating layer ILD may include one of a silicon nitride layer, a silicon oxynitride layer, a silicon oxide layer, a titanium oxide layer, and an aluminum oxide layer.

The first source metal layer SDL1 may be disposed on the interlayer insulating layer ILD. The first source metal layer SDL1 may include a connection electrode CCE. The connection electrode CCE may be connected to an anode connection line ACL (refer to FIGS. 8 and 9) passing through the first protective layer PAS1 and the first via layer VIA1. The connection electrode CCE may be connected to the drain electrode DE of the transistor TFT by passing through the interlayer insulating layer ILD, the second gate insulating layer GI2, and the first gate insulating layer GI1. Therefore, the connection electrode CCE may electrically connect the anode connection line ACL and the drain electrode DE.

The first source metal layer SDL1 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The first via layer VIA1 may be disposed on the first source metal layer SDL1. The first via layer VIA1 may planarize an upper end of the first source metal layer SDL1. The first via layer VIA1 may include an organic layer such as an acryl resin, an epoxy resin, a phenolic resin, a polyamide resin, or a polyimide resin.

The first protective layer PAS1 may be disposed on the first via layer VIA1 to protect the first source metal layer SDL1. The first protective layer PAS1 may include an inorganic layer. For example, the first protective layer PAS1 may include one of a silicon nitride layer, a silicon oxynitride layer, a silicon oxide layer, a titanium oxide layer, and an aluminum oxide layer.

The second source metal layer SDL2 may be disposed on the first via layer VIAL The second source metal layer SDL2 may include the anode connection line ACL. The anode connection line ACL may be connected to an anode connection electrode ACE passing through the second protective layer PAS2 and the second via layer VIA2.

The anode connection line ACL may be connected to the connection electrode CCE by passing through the first protective layer PAS1 and the first via layer VIA1. Therefore, the anode connection line ACL may electrically connect the anode connection electrode ACE and the connection electrode CCE.

The second source metal layer SDL2 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The second via layer VIA2 may be disposed on the second source metal layer SDL2. The second via layer VIA2 may planarize an upper end of the second source metal layer SDL2. The second via layer VIA2 may include an organic layer such as an acryl resin, an epoxy resin, a phenolic resin, a polyamide resin, or a polyimide resin.

The second protective layer PAS2 may be disposed on the second via layer VIA2 to protect the second source metal layer SDL2. The second protective layer PAS2 may include an inorganic layer. For example, the second protective layer PAS2 may include one of a silicon nitride layer, a silicon oxynitride layer, a silicon oxide layer, a titanium oxide layer, and an aluminum oxide layer.

The third source metal layer SDL3 may be disposed on the second via layer VIA2. The third source metal layer SDL3 may include the anode connection electrode ACE. The anode connection electrode ACE may be connected to a first anode electrode AND1 passing through the third protective layer PAS3 and the third via layer VIA3. The anode connection electrode ACE may be connected to the anode connection line ACL by passing through the second protective layer PAS2 and the second via layer VIA2. Therefore, the anode connection electrode ACE may electrically connect the anode AND and the anode connection line ACL.

The third source metal layer SDL3 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The third via layer VIA3 may be disposed on the third source metal layer SDL3. The third via layer VIA3 may planarize an upper end of the third source metal layer SDL3. The third via layer VIA3 may include an organic layer such as an acryl resin, an epoxy resin, a phenolic resin, a polyamide resin, or a polyimide resin.

The third protective layer PAS3 may be disposed on the third via layer VIA3 to protect the third source metal layer SDL3. The third protective layer PAS3 may include an inorganic layer. For example, the third protective layer PAS3 may include one of a silicon nitride layer, a silicon oxynitride layer, a silicon oxide layer, a titanium oxide layer, and an aluminum oxide layer.

The fourth source metal layer SDL4 may be disposed on the third protective layer PAS3. The fourth source metal layer SDL4 may include the first anode electrode AND1, a first cathode electrode CTD1, and a first pad electrode PAD1. The first anode electrode AND1 may be connected to the anode connection electrode ACE by passing through the third protective layer PAS3 and the third via layer VIA3. The first cathode electrode CTD1 may be connected to a power line by passing through the third protective layer PAS3 and the third via layer VIA3. The first pad electrode PAD1 may be connected to the fan-out line FOL by passing through the first to third protective layers PAS1, PAS2, and PAS3, the interlayer insulating layer ILD, and the second gate insulating layer GI2.

The fourth source metal layer SDL4 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The anode layer ANDL may be disposed on the fourth source metal layer SDL4. The anode layer ANDL may include a second anode electrode AND2, a second cathode electrode CTD2, and a second pad electrode PAD2. The anode layer ANDL may include a transparent conductive material (TCO) such as ITO or IZO.

The first anode electrode AND1 and the second anode electrode AND2 may form the anode AND, and the first cathode electrode CTD1 and the second cathode electrode CTD2 may form the cathode CTD. The first pad electrode PAD1 and the second pad electrode PAD2 may form the pad portion PAD.

The pad portion PAD may be disposed on the third protective layer PAS3 in the non-display area NDA. The pad portion PAD may supply a voltage or a signal received from the side surface connection line SCL to the fan-out line FOL. The second pad electrode PAD2 may be electrically connected to the lead line LDL through the side surface connection line SCL.

The fourth via layer VIA4 may be disposed on the third protective layer PAS3 in which the anode AND and the cathode CTD are not formed. The fourth via layer VIA4 may planarize an upper end of the third protective layer PAS3. The fourth via layer VIA4 may include an organic layer such as an acryl resin, an epoxy resin, a phenolic resin, a polyamide resin, or a polyimide resin.

The fourth protective layer PAS4 may be disposed on the fourth via layer VIA4 and may cover a portion of the anode AND, the cathode CTD, and the pad portion PAD. The fourth protective layer PAS4 may include an inorganic layer. For example, the fourth protective layer PAS4 may include one of a silicon nitride layer, a silicon oxynitride layer, a silicon oxide layer, a titanium oxide layer, and an aluminum oxide layer.

The fourth protective layer PAS4 may not cover and may expose a portion of an upper surface of the anode AND. The light emitting element ED may contact the anode AND and the cathode CTD which are not covered by the fourth protective layer PAS4.

The fifth protective layer PAS5 may be disposed on the rear surface of the substrate SUB to planarize the rear surface of the substrate SUB. The fifth protective layer PAS5 may include an inorganic layer. For example, the fifth protective layer PAS5 may include one of a silicon nitride layer, a silicon oxynitride layer, a silicon oxide layer, a titanium oxide layer, and an aluminum oxide layer.

A rear surface electrode BTE may be disposed on one surface or a surface or a rear surface of the fifth protective layer PAS5. The rear surface electrode BTE may supply a voltage or a signal received from the flexible film FPCB to the side surface connection line SCL through the lead line LDL. The rear surface electrode BTE may be electrically connected to the flexible film FPCB through a conductive adhesive member ACF.

The rear surface electrode BTE may include a first rear surface electrode BTE1 and a second rear surface electrode BTE2. The first rear surface electrode BTE1 may be disposed on the one surface or a surface or the rear surface of the fifth protective layer PAS5. The first rear surface electrode BTE1 may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The second rear surface electrode BTE2 may be disposed on one surface or a surface or a rear surface of the first rear surface electrode BTE1. The second rear surface electrode BTE2 may include a transparent conductive material (TCO) such as ITO or IZO.

The lead line LDL may be disposed on the one surface or a surface or the rear surface of the fifth protective layer PAS5. The lead line LDL may be formed of a same material or a similar material on a same layer as the first rear surface electrode BTE1. The lead line LDL may supply a voltage or a signal received from the rear surface electrode BTE to the side surface connection line SCL.

The side surface connection line SCL may be disposed on a lower surface edge, the side surface, and an upper surface edge of the substrate SUB. One end or an end of the side surface connection line SCL may be connected to the lead line LDL, and another end of the side surface connection line SCL may be connected to the pad portion PAD.

The side surface connection line SCL may pass through side surfaces of the substrate SUB, the buffer layer BF, the first and second gate insulating layers GI1 and GI2, the interlayer insulating layer ILD, and the first to third protective layers PAS1, PAS2, and PAS3.

The fifth via layer VIA5 may cover at least a portion of a rear surface of the rear surface electrode BTE and the lead line LDL. The fifth via layer VIA5 may planarize a lower end of the substrate SUB. The fifth via layer VIA5 may include an organic layer such as an acryl resin, an epoxy resin, a phenolic resin, a polyamide resin, or a polyimide resin.

The sixth protective layer PAS6 may be disposed on one surface or a surface or a rear surface of the fifth via layer VIA5 to protect the rear surface electrode BTE and the lead line LDL. The sixth protective layer PAS6 may include an inorganic layer. For example, the sixth protective layer PAS6 may include one of a silicon nitride layer, a silicon oxynitride layer, a silicon oxide layer, a titanium oxide layer, and an aluminum oxide layer.

The flexible film FPCB may be disposed on one surface or a surface or a rear surface of the sixth protective layer PAS6. The flexible film FPCB may be attached to the rear surface of the sixth protective layer PAS6 using an adhesive member. One side or a side of the flexible film FPCB may supply the voltage or the signal to the pad portion PAD disposed on the substrate SUB through the rear surface electrode BTE, the lead line LDL, and the side surface connection line SCL. Another side of the flexible film FPCB may be connected to a source circuit board or the like under or below the substrate SUB. The flexible film FPCB may transmit a signal provided from the source circuit board to the display device 10.

The conductive adhesive member ACF may attach the flexible film FPCB to the rear surface of the rear surface electrode BTE. For example, the conductive adhesive member ACF may include an anisotropic conductive film. In case that the conductive adhesive member ACF may include the anisotropic conductive film, the conductive adhesive member ACF may have conductivity in an area in which the rear surface electrode BTE and the flexible film FPCB are in contact, and may electrically connect the flexible film FPCB to the rear surface electrode BTE.

The display devices 10 may minimize the area of the non-display area NDA by including the flexible film FPCB disposed under or below the substrate SUB, the pad portion PAD disposed on the substrate SUB, and the rear surface electrode BTE, the lead line LDL, and the side surface connection line SCL electrically connecting the flexible film FPCB and the pad portion PAD.

The light emitting element ED may be disposed on the anode AND and the cathode CTD. In an embodiment, the light emitting element ED may include a flip chip type micro LED including a first contact electrode CTE1 and a second contact electrode CTE2 facing the anode AND and the cathode CTD, respectively.

The light emitting element ED may be formed of an inorganic material such as GaN. Each size of a width, a length, and a height of the light emitting element ED may be several to several hundred µm. For example, each size of the width, the length, and the height of the light emitting element ED may be about 100 µm or less.

The light emitting element ED may be formed by growing on a semiconductor substrate such as a silicon wafer. The light emitting element ED may be transferred or directly transferred from the silicon wafer onto the anode AND and the cathode CTD of the substrate SUB. By way of example, the light emitting element ED may be transferred onto the anode AND and the cathode CTD of the substrate SUB through an electrostatic method using an electrostatic head or a stamp method using an elastic polymer material such as PDMS or silicon as a transfer substrate.

The light emitting element ED may include a base substrate SSUB, an n-type semiconductor NSEM, an active layer MQW, a p-type semiconductor PSEM, the first contact electrode CTE1, and the second contact electrode CTE2.

The base substrate SSUB may be a sapphire substrate, but an embodiment of the specification is not limited thereto.

The n-type semiconductor NSEM may be disposed on one surface or a surface of the base substrate SSUB. For example, the n-type semiconductor NSEM may be disposed on a lower surface of the base substrate SSUB. The n-type semiconductor NSEM may be formed of GaN doped with an n-type conductive dopant such as Si, Ge, or Sn.

The active layer MQW may be disposed on a portion of one surface or a surface of the n-type semiconductor NSEM. The active layer MQW may include a material of a single or multiple quantum well structure. In case that the active layer MQW may include the material of the multiple quantum well structure, the active layer MQW may have a structure in which well layers and barrier layers may be alternately stacked each other. At this time, the well layer may be formed of InGaN, and the barrier layer may be formed of GaN or AlGaN, but are not limited thereto. By way of example, the active layer MQW may have a structure in which a semiconductor material having a large band gap energy and a semiconductor material having a small band gap energy may be alternately stacked each other, and may also include group 3 to group 5 semiconductor materials different according to a wavelength band of emitted light.

The p-type semiconductor PSEM may be disposed on one surface or a surface of the active layer MQW. The p-type semiconductor PSEM may be formed of GaN doped with a p-type conductive dopant such as Mg, Zn, Ca, Se, or Ba.

The first contact electrode CTE1 may be disposed on the p-type semiconductor PSEM, and the second contact electrode CTE2 may be disposed on another portion of one surface or a surface of the n-type semiconductor NSEM. The other portion of the one surface or a surface of the n-type semiconductor NSEM on which the second contact electrode CTE2 is disposed may be disposed to be spaced apart from the portion of the one surface or a surface of the n-type semiconductor NSEM on which the active layer MQW is disposed.

The first contact electrode CTE1 and the anode AND may be adhered to each other through a conductive adhesive member such as an anisotropic conductive film or an anisotropic conductive paste. By way of example, the first contact electrode CTE1 and the anode AND may be adhered to each other through a soldering process.

In an embodiment, the second contact electrode CTE2 and the cathode CTD may be adhered to each other through a conductive adhesive member such as an anisotropic conductive film or an anisotropic conductive paste. By way of example, the second contact electrode CTE2 and the cathode CTD may be adhered to each other through a soldering process.

Figure 17:
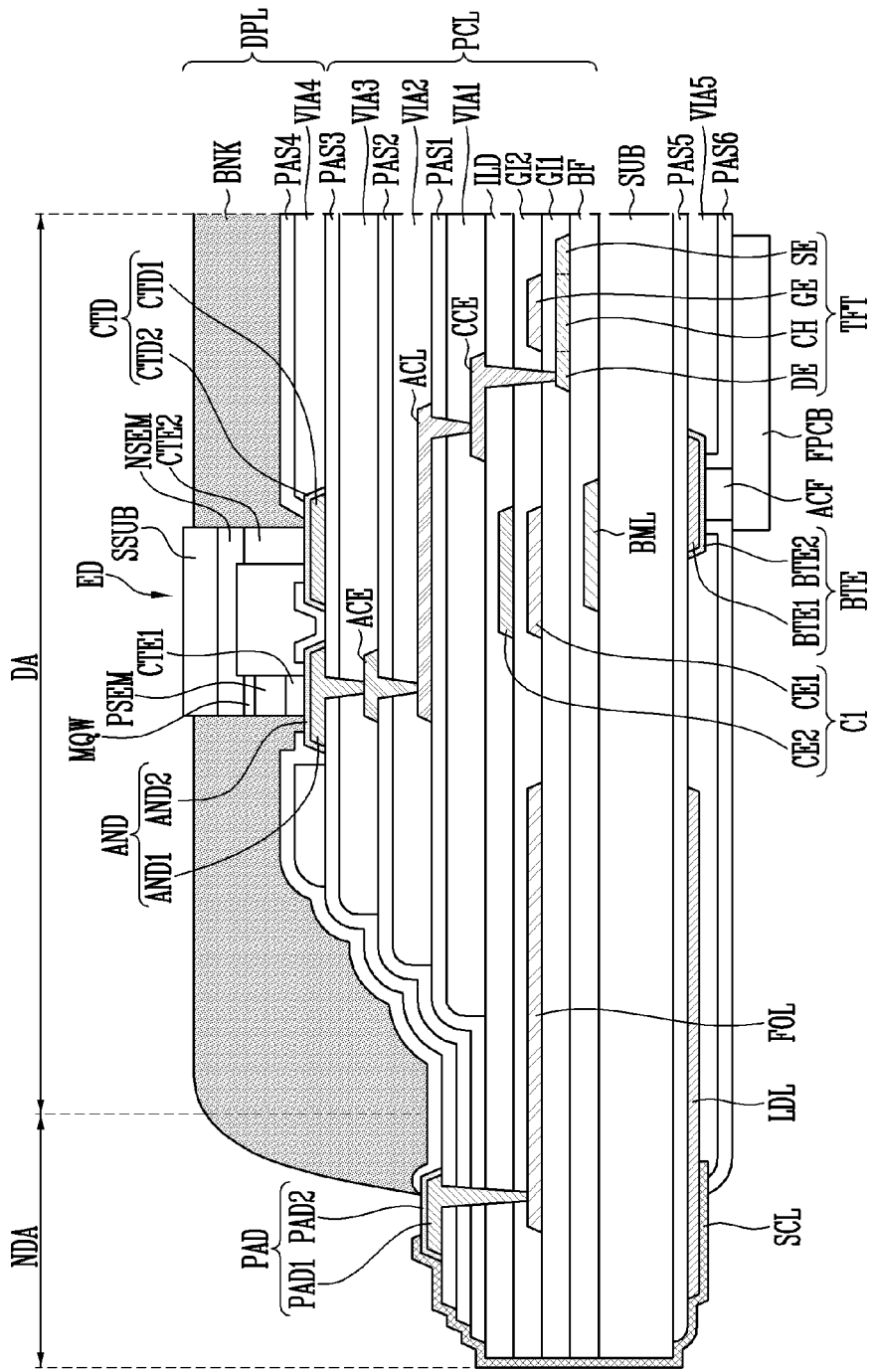
FIG. 17 is a schematic cross-sectional view illustrating an example of the display device of FIG. 5.

FIG. 17 is a schematic cross-sectional view illustrating an example of the display device of FIG. 5.

In FIG. 17, the same reference numerals are used for the components described with reference to FIG. 16, and a repetitive description of such components is omitted. The display device of FIG. 17 may be substantially the same as the display device of FIG. 16, except that a bank BNK is added in FIG. 17.

Referring to FIG. 17, each of the display devices 10 may include the substrate SUB, the pixel circuit layer PCL, and the display element layer DPL.

In an embodiment, the display element layer DPL may further include the bank BNK. The bank BNK may be disposed adjacent to the light emitting element ED. The bank BNK may be a structure defining the emission area of the pixel. The bank BNK may to include at least one light blocking material and/or reflective material to prevent light leakage in which light (or rays) is leaked between adjacent pixels (or light emitting elements ED). According to an embodiment, a reflective material layer may be separately provided and/or formed on the bank BNK to further improve efficiency of light emitted from each pixel. The bank BNK may include an organic material that strengthens an adhesive force between the light emitting element ED and the anode AND and the cathode CTD while stably fixing the light emitting element ED.

The bank BNK may absorb external light to improve a contrast of a screen. According to an embodiment, the bank BNK may have a black color.

Figure 18:
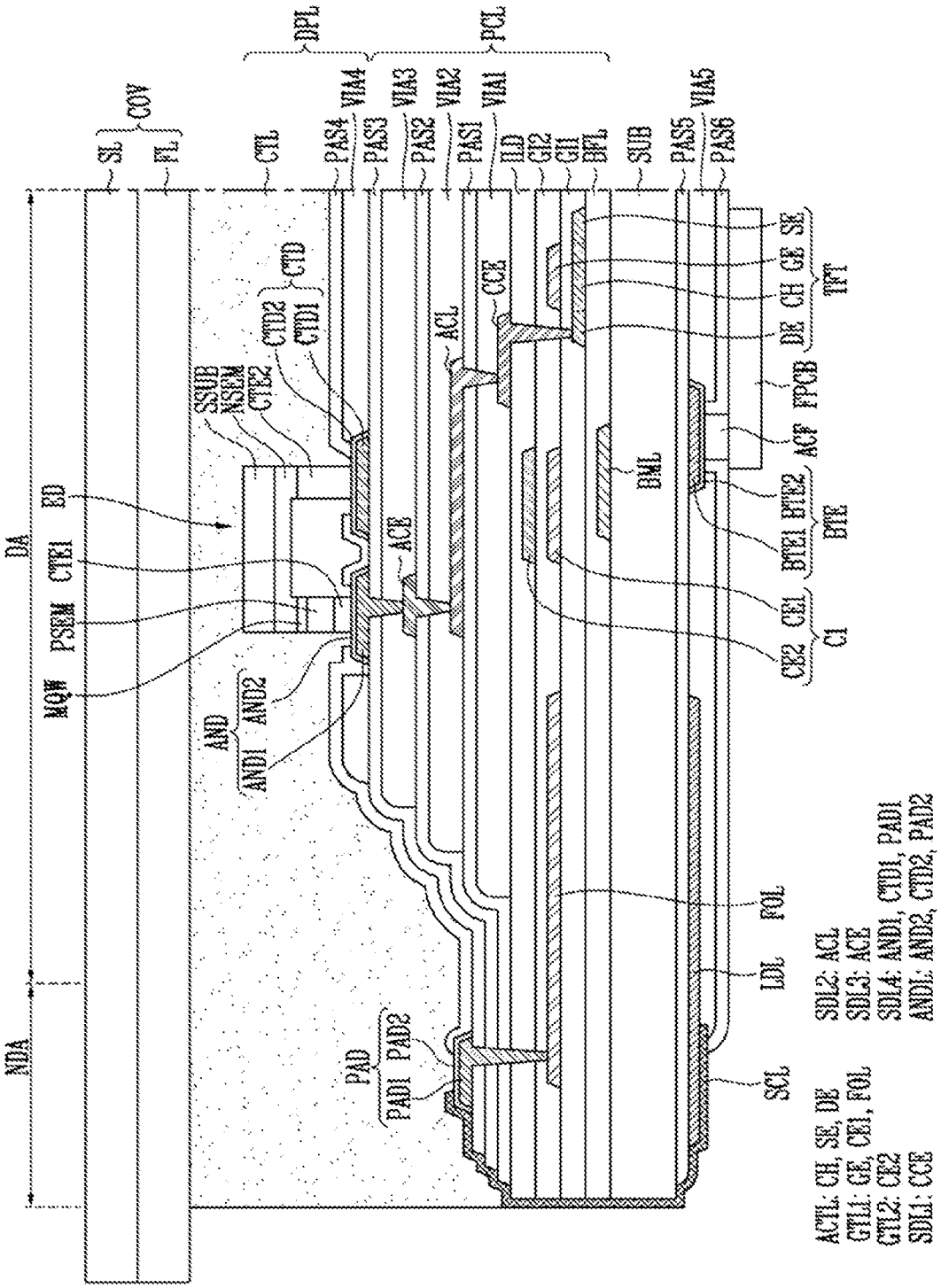
FIG. 18 is a schematic cross-sectional view illustrating an example of the display device of FIG. 5.

FIG. 18 is a schematic cross-sectional view illustrating an example of the display device of FIG. 5.

In FIG. 18, the same reference numerals are used for the components described with reference to FIG. 16, and a repetitive description of such components is omitted. The display device of FIG. 18 may be substantially the same as the display device of FIG. 16, except that a cover layer COV is added in FIG. 18.

Referring to FIG. 18, each of the display devices 10 may include the substrate SUB, the pixel circuit layer PCL, and the display element layer DPL.

In an embodiment, the display device may further include the cover layer COV. The cover layer COV may be disposed on the display element layer DPL using an intermediate layer CTL. The cover layer COV may protrude outside the side surface (or the non-display area NDA of the display device) of the substrate SUB.

The intermediate layer CTL may be a transparent adhere layer (or adhesive layer) for strengthening an adhesive force between the display element layer DPL and the cover layer COV, for example, an optically clear adhesive layer, but is not limited thereto. According to an embodiment, the intermediate layer CTL may include a filler formed of an insulating material having an insulating property and an adhesive property.

The cover layer COV may include a first layer FL and a second layer SL sequentially disposed on the intermediate layer CTL.

The first layer FL may be a light transmittance control layer designed to reduce transmittance of external light or light reflected from the display device 10. A distance between adjacent display devices 10 may be prevented from being visually recognized from the outside, by the first layer FL. The first layer FL may include a phase delay layer, but is not limited thereto.

The second layer SL may be an anti-glare layer designed to diffusely reflect external light to prevent a visibility reduction of an image due to reflection of external light as it is. A contrast ratio of an image displayed by the display device 10 may be increased by the second layer SL. The second layer SL may include a polarizing plate, but is not limited thereto.

Figure 19:
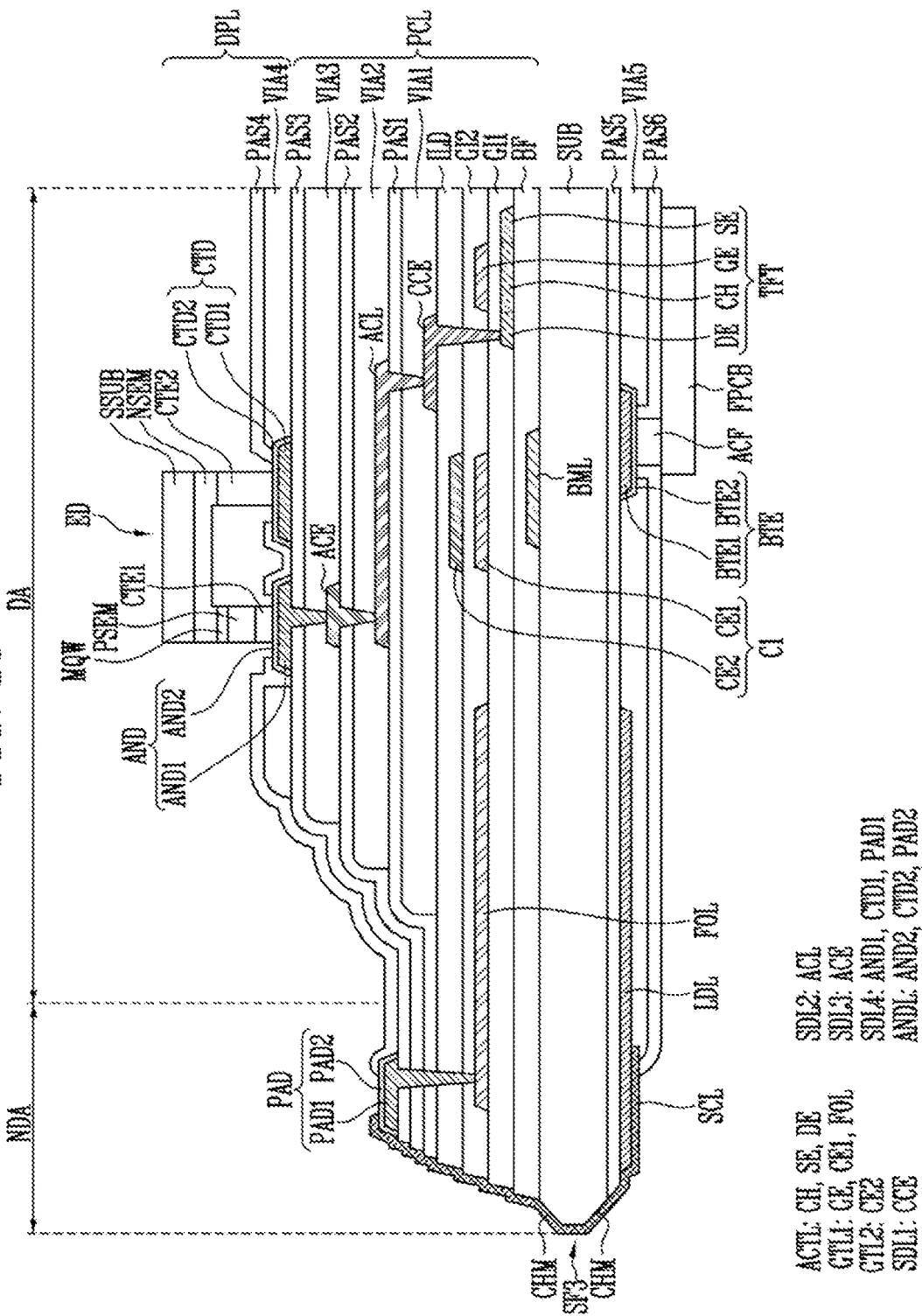
FIG. 19 is a schematic cross-sectional view illustrating an example of the display device of FIG. 5.

FIG. 19 is a schematic cross-sectional view illustrating an example of the display device of FIG. 5.

In FIG. 19, the same reference numerals are used for the components described with reference to FIG. 16, and a repetitive description of such components is omitted. The display device of FIG. 19 may be substantially the same as the display device of FIG. 16, except that a chamfer portion CHM is included in FIG. 19.

Referring to FIG. 19, each of the display devices 10 may include the substrate SUB, the pixel circuit layer PCL, and the display element layer DPL.

In an embodiment, the substrate SUB may include the chamfer portion CHM (or a chamfer surface) formed between the upper surface and the side surface and/or the rear surface and the side surface. The side surface SF3 of the substrate SUB may have an inclination by the chamfer portion CHM. Accordingly, disconnection of the side surface connection line SCL surrounding the upper surface, the side surface, and the rear surface of the substrate SUB may be prevented. The chamfer portion CHM may prevent the substrate SUB of each of the display devices 10 from being collided and damaged in case that the display devices 10 implement the tiled display device TD.

Figure 20:
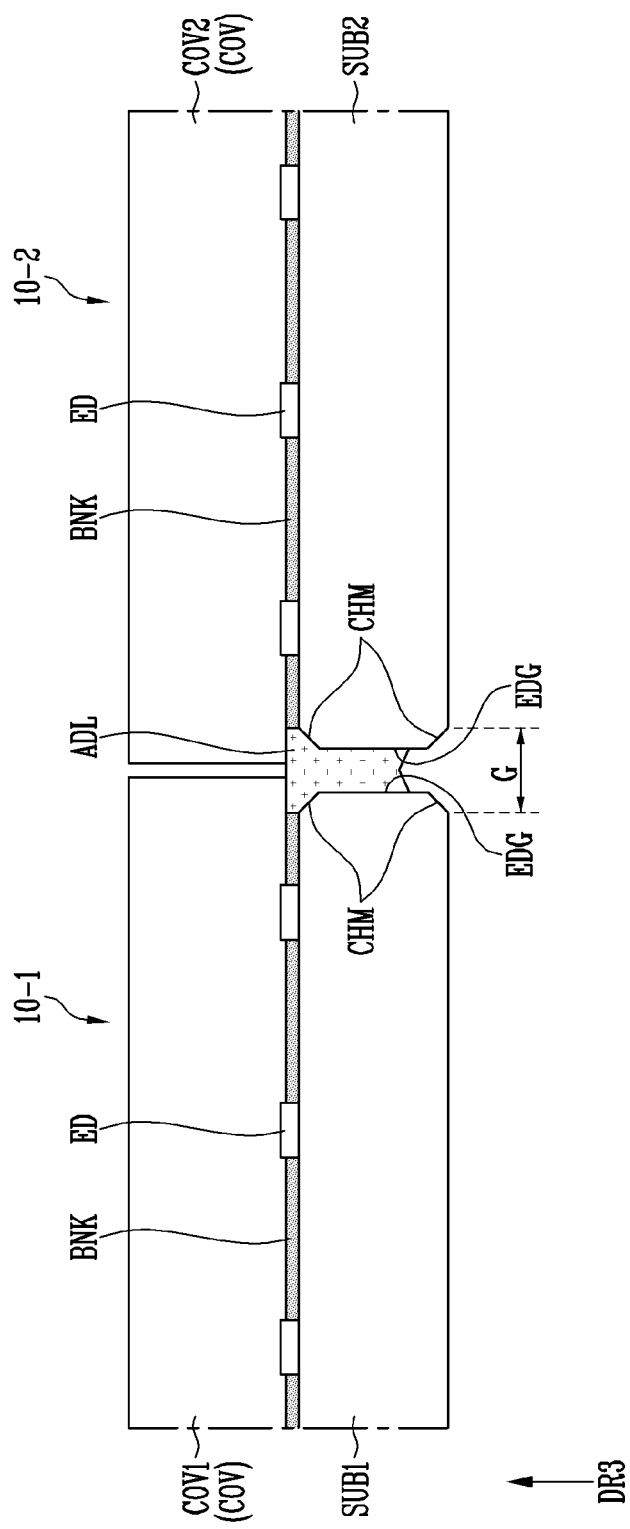
FIG. 20 is a schematic cross-sectional view illustrating an example in which display devices included in the tiled display device of FIG. 4 are connected.

FIG. 20 is a schematic cross-sectional view illustrating an example in which the display devices included in the tiled display device of FIG. 4 are connected.

Referring to FIGS. 4, 16, 17, 18, 19, and 20, the tiled display device TD may include the first display device 10-1 and the second display device 10-2 adjacently connected to each other.

The first display device 10-1 may include a first substrate SUB1, a light emitting element ED, and a first cover layer COV1. The first substrate SUB1, the light emitting element ED, and the first cover layer COV1 may be sequentially stacked along a third direction DR3. The second display device 10-2 may include a second substrate SUB2, a light emitting element ED, and a second cover layer COV2. The second substrate SUB2, the light emitting element ED, and the second cover layer COV2 may be sequentially stacked along the third direction DR3.

Each of the first cover layer COV1 and the second cover layer COV2 may have substantially the same configuration as the cover layer COV described with reference to FIG. 18.

Each of the first substrate SUB1 and the second substrate SUB2 may include the substrate SUB and the pixel circuit layer PCL described with reference to FIGS. 16 to 19.

Each of the first and second display devices 10-1 and 10-2 may include the chamfer portion CHM. The chamfer portion CHM may prevent the first substrate SUB1 and the second substrate SUB2 from being collided and damaged in case that the first and second display devices 10-1 and 10-2 are combined.

The light emitting elements ED and the bank BNK positioned between the light emitting elements ED may be provided on each of the first substrate SUB1 and the second substrate SUB2.

The first cover layer COV1 may be provided to cover the first substrate SUB1 and the light emitting elements ED mounted thereon to protect the first substrate SUB1 and the light emitting elements ED from the outside.

The second cover layer COV2 may be provided to cover the second substrate SUB2 and the light emitting elements ED mounted thereon to protect the second substrate SUB2 and the light emitting elements ED from the outside.

The first cover layer COV1 and the second cover layer COV2 may reduce visibility of the coupling area SM (or seam) formed by a gap G formed between the first substrate SUB1 (or the display device 10-1) and the second substrate SUB2 (or the second display device 10-2), and may improve a color deviation between the first display device 10-1 and the second display device 10-2.

The first cover layer COV1 may protrude outside an edge EDG of the first substrate SUB1, and the second cover layer COV2 may protrude outside an edge EDG of the second substrate SUB2. The gap G between the first substrate SUB1 and the second substrate SUB2 may be greater than a gap between the first cover layer COV1 and the second cover layer COV2.

In an embodiment, an additional member ADL may be disposed in the gap G between the first substrate SUB1 and the second substrate SUB2.

The additional member ADL may be provided to absorb light incident on the gap G. The additional member ADL may cover the chamfer portion CHM of the first substrate SUB1 and the second substrate SUB2. The additional member ADL may fill both of spaces between the first substrate SUB1 and the first cover layer COV1 and between the second substrate SUB2 and the second cover layer COV2. The additional member ADL may prevent a foreign substance or moisture from being introduced into each of the spaces between the first substrate SUB1 and the first cover layer COV1 and between the second substrate SUB2 and the second cover layer COV2. The additional member ADL may include a material that absorbs light. As an example, the additional member ADL may include a photosensitive material, but is not limited thereto.

Figure 21:
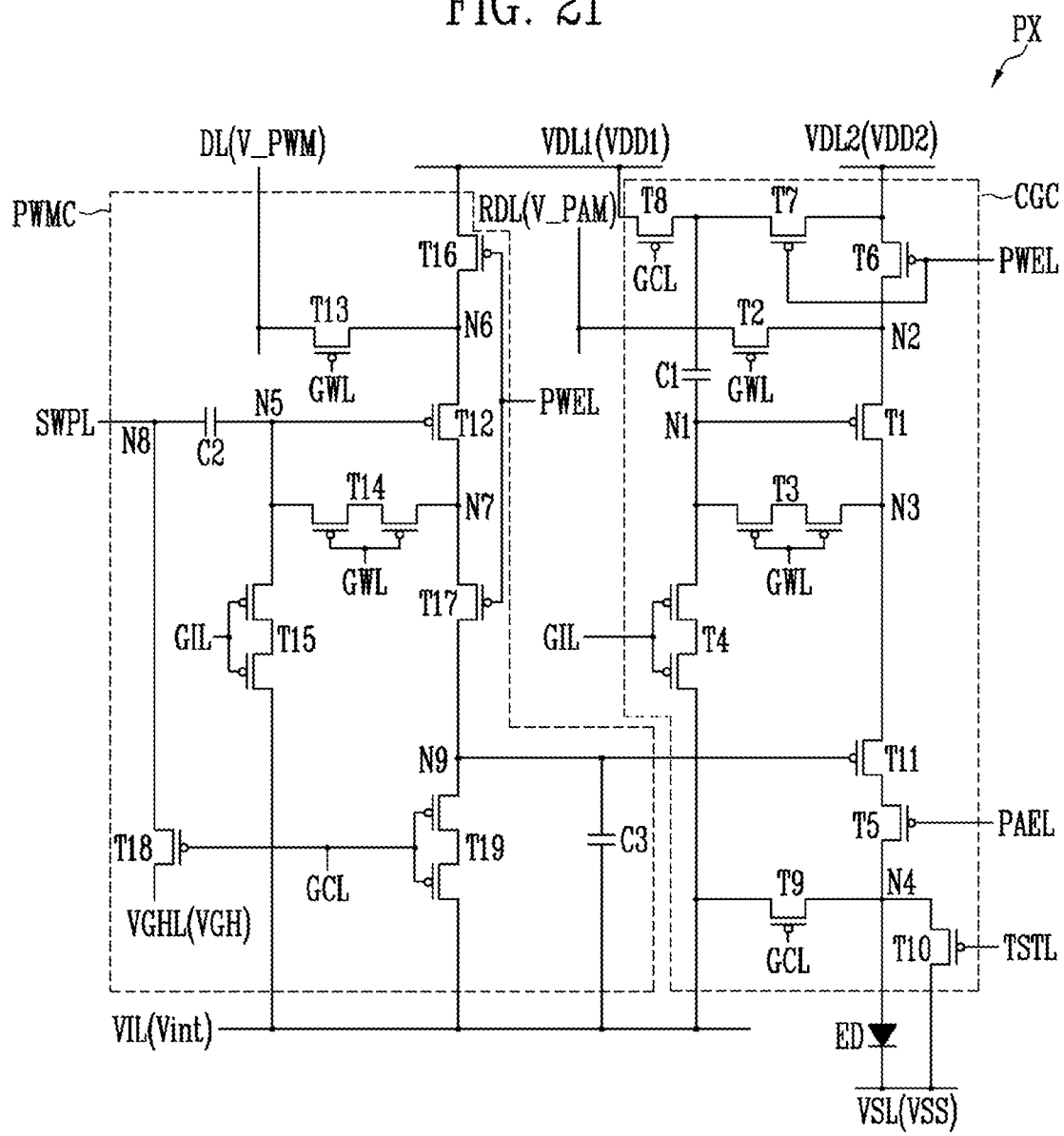
FIG. 21 is a schematic diagram of an equivalent circuit of a pixel included in the display device of FIG. 5.
Figure 22:
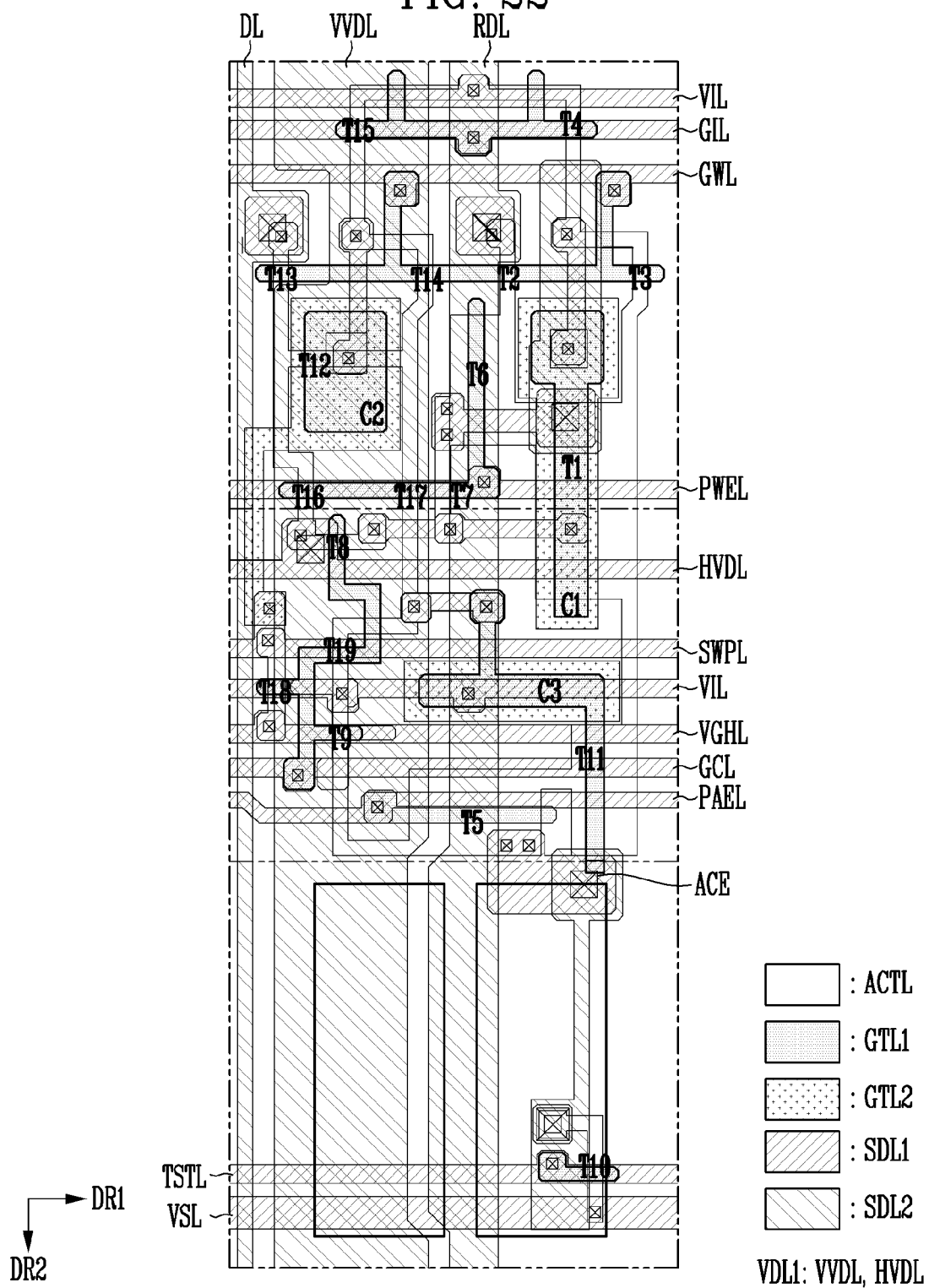
FIG. 22 is a schematic plan diagram illustrating an example of a pixel circuit included in the pixel of FIG. 21.

FIG. 21 is a schematic diagram of an equivalent circuit of a pixel included in the display device of FIG. 5, and FIG. 22 is a schematic plan diagram illustrating an example of a pixel circuit included in the pixel of FIG. 21.

Referring to FIGS. 16, 21, and 22, the pixel PX may include the pixel circuit PC and the light emitting element ED.

The light emitting element ED may be an inorganic light emitting diode of a micro size or a nano size.

In an embodiment, the pixel circuit PC may include a PWM circuit PWMC and a current generation circuit CGC. The current generation circuit CGC may generate a constant current (hereinafter, referred to as a driving current) of a magnitude supplied to the light emitting element ED. The PWM circuit PWMC may control a time during which the driving current is supplied to the light emitting element ED based on a PWM data voltage V_PWM.

As shown in FIG. 22, an initialization voltage line VIL, an initialization scan line GIL, a write scan line GWL, a PWM emission control line PWEL, a horizontal power line HVDL, a gate-off voltage line VGHL, a sweep signal line SWPL, a control scan line GCL, a PAM emission control line PAEL, a test signal line TSTL, and a third power line VSL may extend in the first direction DR1 and may be spaced apart in the second direction DR2. The initialization voltage line VIL, the initialization scan line GIL, the write scan line GWL, the PWM emission control line PWEL, the horizontal power line HVDL, the gate-off voltage line VGHL, the sweep signal line SWPL, the control scan line GCL, the PAM emission control line PAEL, the test signal line TSTL, and the third power line VSL may be formed by the first source metal layer SDL1 disposed on the interlayer insulating layer ILD.

For example, the initialization scan line GIL, the write scan line GWL, the PWM emission control line PWEL, the control scan line GCL, the PAM emission control line PAEL, and the test signal line TSTL may be connected to gate electrodes of each of corresponding transistors through contact holes passing through the interlayer insulating layer ILD and the second gate insulating layer GI2, respectively.

For example, the initialization voltage line VIL, the horizontal power line HVDL, the gate-off voltage line VGHL, the sweep signal line SWPL, and the third power line VSL may be connected to source electrodes SE or drain electrodes DE of each of the corresponding transistors through contact holes passing through the second gate insulating layer GI2 and the first gate insulating layer GI1, respectively.

A data line DL, a vertical power line VVDL, and a PAM data line RDL may extend in the second direction DR2 and may be spaced apart in the first direction DR1. The data line DL, the vertical power line VVDL, and the PAM data line RDL may be formed by the second source metal layer SDL2 disposed on the first protective layer PAS1.

The data line DL and the PAM data line RDL may be connected to the source electrodes SE or the drain electrodes DE of each of the corresponding transistors through contact holes passing through the first protective layer PAS1, the first via layer VIA1, the interlayer insulating layer ILD, the second gate insulating layer GI2, and the first gate insulating layer GI1, respectively.

In an embodiment, the vertical power line VVDL and the horizontal power line HVDL may be disposed on different layers and may be connected to each other through a contact hole passing through the first protective layer PAS1 and the first via layer VIA1. The vertical power line VVDL and the horizontal power line HVDL may form a first power line VDL1.

In an embodiment, although not shown, a second power line VDL2 may be formed of the third source metal layer SDL3 disposed on the second protective layer PAS2. The second power line VDL2 may be connected to sixth and seventh transistors T6 and T7 through contact holes passing through the second protective layer PAS2, the second via layer VIA2, the first protective layer PAS1, and the first via layer VIA1.

Each of first to nineteenth transistors T1 to T19 may be stacked in a structure similar to that of the transistor TFT described with reference to FIG. 16. For example, each of the first to ninth transistors T1 to T19 may include the channel CH, the source electrode SE, the drain electrode DE formed in the active layer ACTL, and the gate electrode GE formed in a first gate layer GTL1. For convenience of description, in FIG. 22, the gate electrode formed in the first gate layer GTL1 and a channel CH portion of the active layer ACTL overlapping the gate electrode are defined as the transistors T1 to T19. It may be understood that both sides of the channel CH of the active layer ACTL are the source electrode SE and the drain electrode DE (or one electrode and another electrode), respectively.

In an embodiment, the active layer ACTL including the channels CH, the source electrodes SE, and the drain electrodes DE of the first to nineteenth transistors T1 to T19 may be integral with each other.

Each of first to third capacitors C1, C2, and C3 may be stacked in a structure similar to that of the first capacitor C1 described with reference to FIG. 16. For example, each of the first to third capacitors C1, C2, and C3 may include a lower electrode formed in the first gate layer GTL1 and an upper electrode formed in the second gate layer GTL2.

In an embodiment, the current generation circuit CGC may include the first to eleventh transistors T1 to T11 and the first capacitor C1.

The first transistor T1 may generate the driving transistor supplied to the light emitting element ED during an emission period as a driving transistor.

The second transistor T2 may be connected between the PAM data line RDL and a second node N2. A gate electrode of the second transistor T2 may be connected to the write scan line GWL through a contact hole. The second transistor T2 may be turned on in response to the write scan signal supplied to the write scan line GWL.

A PAM data voltage V_PAM may be supplied to the PAM data line RDL. The PAM data voltage V_PAM may determine a magnitude of the driving current. A light emitting luminance of the light emitting element ED, which is an inorganic light emitting diode, is not sensitive to a driving current change differently from an organic light emitting diode. Therefore, the light emitting luminance of the light emitting element ED may be controlled by a time during which the driving current is supplied rather than the magnitude of the driving current.

In an embodiment, the PAM data voltage V_PAM may be supplied with the same magnitude to the same type of sub-pixels emitting light of the same color regardless of a grayscale or the like within the spirit and the scope of the disclosure. However, this is an example, and the PAM data voltage V_PAM may change according to a reference.

The third transistor T3 may be electrically connected between a gate electrode (for example, a first node N1) of the first transistor T1 and a drain electrode (for example, a third node N3) of the first transistor T1. A gate electrode of the third transistor T3 may be connected to the write scan line GWL.

The third transistor T3 may be turned on together with the second transistor T2 to diode-connect the first transistor T1, thereby compensating for a threshold voltage of the first transistor T1. In an embodiment, the third transistor T3 may have a form in which transistors in which gate electrodes are commonly connected are connected in series. For example, as shown in FIG. 22, the gate electrode of the third transistor T3 may be divided into two branches and each of the two branches may overlap the active layer ACTL.

The fourth transistor T4 may be connected between the first node N1 and the initialization voltage line VIL supplying a voltage of initialization power Vint. A gate electrode of the fourth transistor T4 may be connected to the initialization scan line GIL through a contact hole. The fourth transistor T4 may be turned on in response to the initialization scan signal supplied to the initialization scan line GIL. In case that the fourth transistor T4 is turned on, the voltage of the initialization power Vint may be supplied to the first node N1. For example, a gate voltage of the first transistor T1 may be initialized.

In an embodiment, the fourth transistor T4 may have a form in which transistors in which gate electrodes are commonly connected are connected in series. For example, as shown in FIG. 22, the gate electrode of the fourth transistor T4 may be divided into two branches and each of the two branches may overlap the active layer ACTL.

The voltage of the initialization power Vint may be sufficiently low to turn on transistors.

The fifth transistor T5 may be connected between the third node N3 and an anode electrode (for example, a fourth node N4) of the light emitting element ED. For example, a drain electrode of the fifth transistor T5 may be connected to the anode connection electrode ACE through a contact hole. The anode connection electrode ACE may be connected to an upper anode AND of FIG. 16 through a contact hole.

A gate electrode of the fifth transistor T5 may be connected to the PAM emission control line PAEL through a contact hole. The fifth transistor T5 may be turned on in response to the PAM emission control signal supplied to the PAM emission control line PAEL.

The sixth transistor T6 may be connected between the second power line VDL2 supplying a voltage of second power VDD2 and the second node N2. A gate electrode of the sixth transistor T6 may be connected to the PWM emission control line PWEL through a contact hole. The sixth transistor T6 may be turned on in response to the PWM emission control signal supplied to the PWM emission control line PWEL. In an embodiment, the PWM emission control signal and the PAM emission control signal may be provided at the same timing.

The seventh transistor T7 may be connected between the second power line VDL2 and the second capacitor electrode CE2 (shown in FIG. 16, for example, an upper electrode) of the first capacitor C1. The second capacitor electrode CE2 of the first capacitor C1 may be formed in the second gate layer GTL2. A gate electrode of the seventh transistor T7 may be connected to the PWM emission control line PWEL through a contact hole.

The seventh transistor T7 may be turned on in response to the PWM emission control signal. Therefore, the second capacitor electrode CE2 of the first capacitor C1 may be connected to the second power VDD2 during the emission period.

The eighth transistor T8 may be connected between the first power line VDL1 supplying a voltage of first power VDD1 and the second capacitor electrode CE2 of the first capacitor C1. For example, one electrode of the eighth transistor T8 may be connected to the vertical power line VVDL through a contact hole, and another electrode may be connected to the second capacitor electrode CE2 of the first capacitor C1 through a contact hole.

A gate electrode of the eighth transistor T8 may be connected to the control scan line GCL through a contact hole. The eighth transistor T8 may be turned on in response to a control scan signal. In case that the eighth transistor T8 is turned on, the voltage of the first power VDD1 may be supplied to the second capacitor electrode CE2 of the first capacitor C1.

The voltage of the first power VDD1 and the voltage of the second power VDD2 may be the same or different from each other.

The write scan signal, the initialization scan signal, and the control scan signal may be supplied in a non-emission period. The initialization scan signal may be supplied before the write scan signal. The control scan signal may be supplied at the same timing as the write scan signal. However, this is an example, and the control scan signal may be supplied after the write scan signal is supplied.

The first capacitor electrode CE1 of the first capacitor C1 may be connected to the gate electrode of the first transistor T1, for example, the first node N1. For example, the first capacitor electrode CE1 of the first capacitor C1 and the gate electrode of the first transistor T1 may be integral with each other. A portion of the gate electrode of the first transistor T1, which overlaps the second capacitor electrode CE2 of the first capacitor C1 may be understood as the first capacitor electrode CE1.

The first capacitor C1 may serve as a storage capacitor that stores the PAM data voltage V_PAM.

The ninth transistor T9 may be connected between the drain electrode of the fifth transistor T5 corresponding to the fourth node N4 and the initialization voltage line VIL. One electrode of the ninth transistor T9 may be connected to the initialization voltage line VIL through a contact hole.

A gate electrode of the ninth transistor T9 may be connected to the control scan line GCL through a contact hole. The ninth transistor T9 may supply the voltage of the initialization power Vint to the fourth node N4 in response to the control scan signal. Therefore, the voltage of the initialization power Vint may be provided to the anode AND through the anode connection electrode ACE.

The tenth transistor T10 may be connected between the fourth node N4 and the third power line VSL supplying the third power VSS. The tenth transistor T10 may be turned on in response to a test voltage supplied to the test signal line TSTL.

The tenth transistor T10 may be turned on according to the test voltage to check whether the pixel circuit PC is abnormal before the light emitting element ED and the pixel circuit PC are connected during a manufacturing process. One electrode of the tenth transistor T10 may be electrically connected to the anode connection electrode ACE through a contact hole, and another electrode may be connected to the third power line VSL through a contact hole. A voltage of third power VSS supplied to the third power line VSL may be lower than the voltages of the first power VDD1 and the second power VDD2. For example, the voltage of the third power VSS may correspond to a ground voltage.

A gate electrode of the tenth transistor T10 may be connected to the test signal line TSTL through a contact hole.

The eleventh transistor T11 may be connected between the third node N3 and the fifth transistor T5. For example, the eleventh transistor T11 may be formed between the first transistor T1 and the fifth transistor T5.

A gate electrode of the eleventh transistor T11 may be connected to the lower electrode of the third capacitor C3. The gate electrode of the eleventh transistor T11 and the lower electrode of the third capacitor C3 may be connected to a ninth node N9.

The eleventh transistor T11 may be turned on based on a voltage of the ninth node N9. A turn-on time of the eleventh transistor T11 may correspond to the emission period (an emission duty) of the light emitting element ED.

The PWM circuit PWMC may control the turn-on time of the eleventh transistor T11 based on the PWM data voltage V_PWM. The PWM circuit PWMC may include the twelfth to nineteenth transistors T12 to T19, the second capacitor C2, and the third capacitor C3.

The twelfth transistor T12 may be turned on during the emission period based on the PWM data voltage V_PWM and a sweep voltage supplied to the sweep signal line SWPL. The twelfth transistor T12 may be connected between a sixth node N6 and a seventh node N7. A gate electrode of the twelfth transistor T12 may correspond to a fifth node N5.

The thirteenth transistor T13 may be connected between the data line DL and the sixth node N6 (for example, one electrode of the twelfth transistor T12).

A gate electrode of the thirteenth transistor T13 may be connected to the write scan line GWL through a contact hole. The thirteenth transistor T13 may provide the PWM data voltage V_PWM to the sixth node N6 in response to the write scan signal.

The fourteenth transistor T14 may be connected between the fifth node N5 and the seventh node N7. For example, the twelfth transistor T12 and the fourteenth transistor T14 may be connected to each other through a connection pattern of the second source metal layer SDL2.

A gate electrode of the fourteenth transistor T14 may be connected to the write scan line GWL through a contact hole. The fourteenth transistor T14 may compensate for a threshold voltage of the twelfth transistor T12 by diode-connecting the twelfth transistor T12 in response to the write scan signal. The PWM data voltage V_PWM in which a threshold voltage is compensated may be provided to the fifth node N5.

In an embodiment, the fourteenth transistor T14 may have a form in which transistors in which gate electrodes are commonly connected are connected in series. For example, as shown in FIG. 22, the gate electrode of the fourteenth transistor T14 may be divided into two branches and each of the two branches may overlap the active layer ACTL.

The fifteenth transistor T15 may be connected between the fifth node N5 and the initialization voltage line VIL. A gate electrode of the fifteenth transistor T15 may be connected to the initialization scan line GIL through a contact hole. The fifteenth transistor T15 may supply the voltage of the initialization power Vint to the fifth node N5 in response to the initialization scan signal supplied to the initialization scan line GIL.

In an embodiment, the fifteenth transistor T15 may have a form in which transistors in which gate electrodes are commonly connected are connected in series. For example, as shown in FIG. 22, the gate electrode of the fifteenth transistor T15 may be divided into two branches and each of the two branches may overlap the active layer ACTL.

The sixteenth transistor T16 may be connected between the first power line VDL1 and the sixth node N6. A gate electrode of the sixteenth transistor T16 may be connected to the PWM emission control line PWEL through a contact hole.

The seventeenth transistor T17 may be connected between the seventh node N7 and the ninth node N9. A gate electrode of the seventeenth transistor T17 may be connected to the PWM emission control line PWEL through a contact hole.

The sixteenth and seventeenth transistors T16 and T17 may be turned on in response to the PWM emission control signal. For example, the sixteenth and seventeenth transistors T16 and T17 may provide a conductive path between the first power line VDL1 and the ninth node N9.

The eighteenth transistor T18 may be connected between an eighth node N8 to which the sweep signal line SWPL is connected and the gate-off voltage line VGHL supplying a gate-off voltage VGH (for example, a high potential voltage). For example, one electrode of the eighteenth transistor T18 may be connected to the sweep signal line SWPL through a contact hole, and another electrode may be connected to the gate-off voltage line VGHL through a contact hole.

The eighteenth transistor T18 may supply a voltage of the high potential power VGH to the eighth node N8 in response to a third scan signal.

Therefore, in case that the fifteenth and eighteenth transistors T15 and T18 are simultaneously turned on, a voltage difference between the gate-off voltage VGH and the initialization power Vint may be stored at both ends of the second capacitor C2.

The nineteenth transistor T19 may be connected between the ninth node N9 and the initialization voltage line VIL. One electrode of the nineteenth transistor T19 may be connected to the gate electrode of the eleventh transistor T11 through a contact hole and a connection pattern connected thereto. Another electrode of the nineteenth transistor T19 may be connected to the initialization voltage line VIL through a contact hole.

A gate electrode of the nineteenth transistor T19 may be connected to the control scan line GCL through a contact hole. The nineteenth transistor T19 may supply the voltage of the initialization power Vint to the ninth node N9 in response to the control scan signal.

The third capacitor C3 may be connected between the ninth node N9 and the initialization voltage line VIL. For example, the lower electrode of the third capacitor C3 may be integral with the gate electrode of the fifteenth transistor T15, and the upper electrode of the third capacitor C3 may overlap therewith to be formed in the second gate layer GTL2. The upper electrode of the third capacitor C3 may be connected to the initialization voltage line VIL through a contact hole.

Accordingly, the voltage of the initialization power Vint may be charged in the third capacitor C3, and the ninth node N9 may maintain the voltage of the initialization power Vint.

In an embodiment, the nineteenth transistor T19 may have a form in which transistors in which gate electrodes are commonly connected are connected in series. For example, as shown in FIG. 22, the gate electrode of the nineteenth transistor T19 may have a bent shape, and two portions may overlap the active layer ACTL.

Thereafter, in case that the fifth and sixth transistors T5 and T6 are turned on, a current path may be formed between the second power line VDL2 and the third power line VSL to turn on the eleventh transistor T11, and the light emitting element ED may emit light. For example, emission of the light emitting element ED may be started in a turn-off state of the twelfth transistor T12.

The PWM circuit PWMC may control the emission time of the light emitting element ED based on a voltage set at the fifth node N5. For example, the PWM circuit PWMC may control supply of the driving current by controlling an operation of the eleventh transistor T11 based on the voltage set at the fifth node N5.

In an embodiment, the PWM data voltage V_PWM may have a voltage range that turns off the twelfth transistor T12. For example, the PWM data voltage V_PWM may be determined within a voltage range of about 10V to about 15V. At this time, the voltage of the first power VDD1 may be about 10V. Therefore, in case that the sixteenth and seventeenth transistors T16 and T17 are turned on and the voltage of the first power VDD1 is supplied to the sixth node N6, a gate-source voltage of the twelfth transistor T12 is greater than or equal to a threshold voltage, and thus the twelfth transistor T12 may be turned off. In case that the twelfth transistor T12 is turned off, the eleventh transistor T11 may maintain a turn-on state by the voltage of the initialization power Vint stored in the third capacitor C3, and the emission time of the light emitting element ED may be maintained.

However, in case that the voltage of the fifth node N5 is changed and the gate-source voltage of the twelfth transistor T12 is decreased to be less than the threshold voltage, the twelfth transistor T12 may be turned on, and the voltage of the first power VDD1 may be supplied to turn off the eleventh transistor T11. Accordingly, the emission of the light emitting element ED may be stopped.

Specifically, the sweep voltage provided to the sweep signal line SWPL may be changed in synchronization with supply of the PAM emission control signal and the PWM emission control signal. For example, the sweep voltage may have a triangular wave shape that decreases during a period in which the PAM emission control signal and the PWM emission control signal are supplied. For example, the sweep voltage may be a voltage that linearly decreases from about 15V to about 10V, but is not limited thereto.

Since the change of the sweep voltage is connected or coupled to the fifth node N5 through the second capacitor C2, the voltage of the fifth node N5 may change according to the change of the sweep voltage. Therefore, a time point at which the twelfth transistor T12 is turned on may be determined according to a magnitude of the voltage set at the fifth node N5 by writing of the PWM data voltage V_PWM, and the emission time of the light emitting element may be controlled.

The light emitting luminance may be adjusted through control of the emission time of the light emitting element.

However, the structure of the pixel circuit is not limited by FIGS. 21 and 22, and various pixel circuit structures may be possible.

Figure 23:
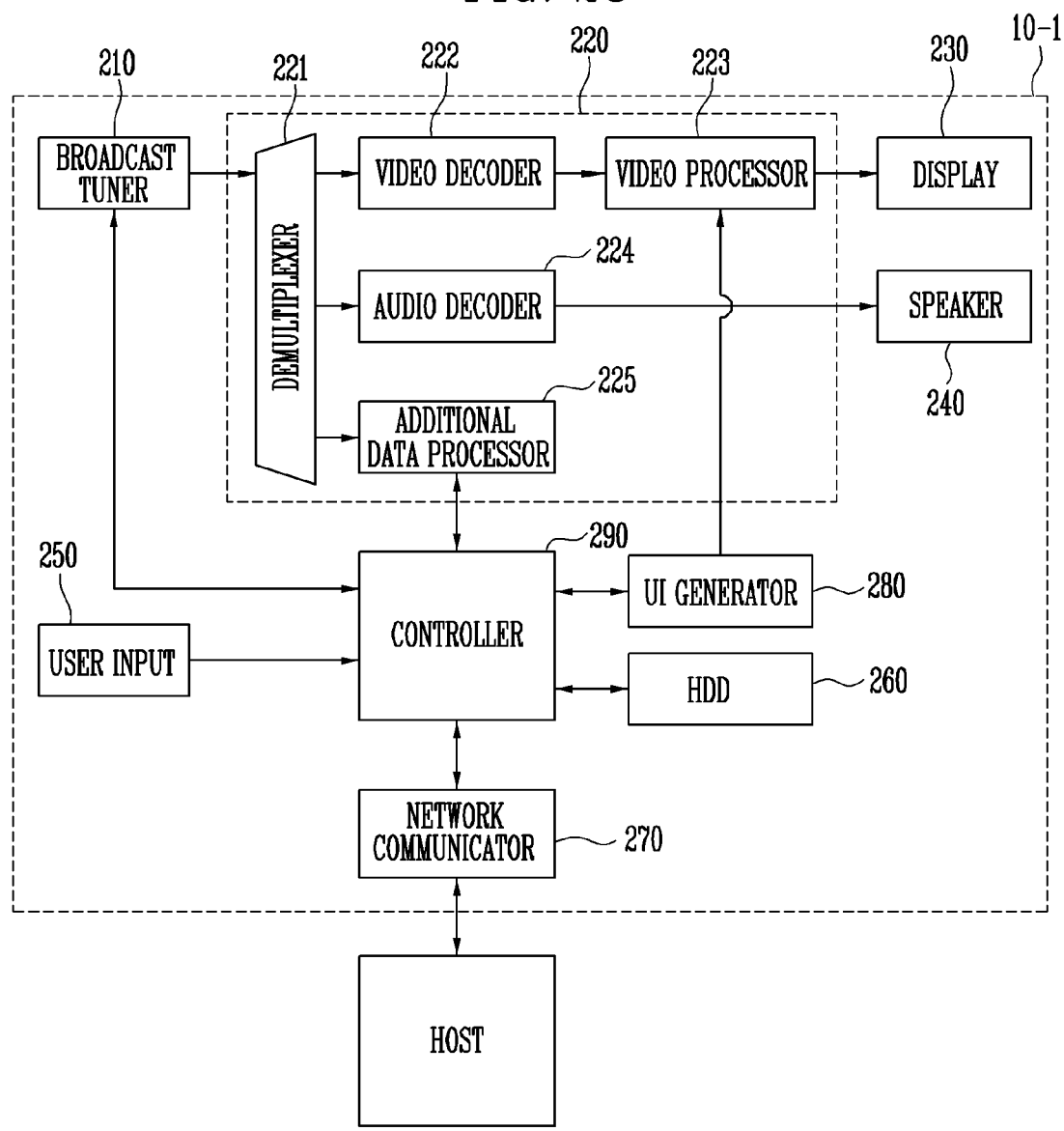
FIG. 23 is a block diagram illustrating an example of the tiled display device of FIG. 4.

FIG. 23 is a block diagram illustrating an example of the tiled display device of FIG. 4.

In FIG. 23, the first display device 10-1 and a host system HOST are shown for convenience of description.

Referring to FIGS. 4 and 23, the tiled display device TD according to an embodiment may include the host system HOST, a broadcast tuner 210, a signal processor 220, a display 230, a speaker 240, a user input 250, a storage 260, a network communicator 270, a UI generatior 280, and a controller 290.

The host system HOST may be implemented as any one of a television system, a home theater system, a set-top box, a navigation system, a DVD player, a Blu-ray player, a personal computer (PC), a mobile phone system, and a tablet.

A user's instruction may be input to the host system HOST in various formats. For example, an instruction by a user's touch input may be input to the host system HOST. By way of example, a user's instruction may be input to the host system HOST by a keyboard input or a button input of a remote controller.

The host system HOST may receive original video data corresponding to an original image from the outside. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image, in response to the first display device 10-1, the second display device 10-2, the third display device 10-3, and the fourth display device 10-4.

The host system HOST may transmit the first video data to the first display device 10-1, transmit the second video data to the second display device 10-2, transmit the third video data to the third display device 10-3, and transmit the fourth video data to the fourth display device 10-4.

The first display device 10-1 may display the first image according to the first video data, the second display device 10-2 may display the second image according to the second video data, the third display device 10-3 may display the third image according to the third video data, and the fourth display device 10-4 may display the fourth image according to the fourth video data. Accordingly, the user may view the original image in which the first to fourth images displayed on the first to fourth display devices 10-1, 10-2, 10-3, and 10-4 are combined.

The first display device 10-1 may include the broadcast tuner 210, the signal processor 220, the display 230, the speaker 240, the user input 250, the storage 260, the network communicator 270, the UI generator 280, and the controller 290.

The broadcast tuner 210 may tune a channel frequency under control of the controller 290 and receive a broadcast signal of a corresponding channel through an antenna. The broadcast tuner 210 may include a channel detection module and an RF demodulation module.

A broadcast signal demodulated by the broadcast tuner 210 is processed by the signal processor 220 and output to the display 230 and the speaker 240. Here, the signal processor 220 may include a demultiplexer 221, a video decoder 222, a video processor 223, an audio decoder 224, and an additional data processor 225.

The demultiplexer 221 divides the demodulated broadcast signal into a video signal, an audio signal, and additional data. The divided video signal, audio signal, and additional data are restored by the video decoder 222, the audio decoder 224, and the additional data processor 225, respectively. At this time, the video decoder 222, the audio decoder 224, and the additional data processor 225 restore as a decoding format corresponding to an encoding format in case that the broadcast signal is transmitted.

A decoded video signal is converted by the video processor 223 to fit a vertical frequency, resolution, a screen ratio, and the like corresponding to an output standard of the display 230, and a decoded audio signal is output to the speaker 240.

The display 230 may include a panel 100 on which an image is displayed, and a panel driver controlling driving of the panel 100.

The user input 250 may receive a signal transmitted from the host system HOST. The user input 250 may be provided to receive data for selection of an instruction related to communication with other display devices (for example, 10-2 to 10-4 in FIG. 5) by the user and input data for an input as well as data related to selection of a channel transmitted by the host system HOST, and selection and manipulation of a user interface (UI) menu.

The storage 260 stores various software programs including an OS program, a recorded broadcast program, a moving picture, a photo, and other data, and may be formed of a storage medium such as a hard disk or a nonvolatile memory.

The network communicator 270 is for short-range communication with the host system HOST and the other display devices DV2 to DV4, and may be implemented with a communication module including an antenna pattern that may implement mobile communication, data communication, Bluetooth, RF, Ethernet, and the like within the spirit and the scope of the disclosure.

The network communicator 270 may transmit and receive wireless signal with at least one of a base station, an external terminal, and a server on a mobile communication network built according to technical standards or a communication method (for example, global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, or the like) for mobile communication through an antenna pattern to be described later.

The network communicator 270 may transmit and receive a wireless signal in a communication network according to wireless Internet technologies through the antenna pattern to be described later. The wireless Internet technologies may include, for example, wireless LAN (WLAN), wireless-fidelity (Wi-Fi), wireless fidelity (Wi-Fi) direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like, and the antenna pattern transmits and receives data according to at least one wireless Internet technology within a range including an Internet technology which is not listed above.

The UI generator 280 generates a UI menu for communication with the host system HOST and the other display devices DV2 to DV4, and may be implemented by an algorithm code and an OSD IC. The UI menu for communication with the host system HOST and the other display devices may be a menu for designating a counterpart digital TV for communication and selecting a desired function.

The controller 290 is in charge of overall control of the first display device 10-1 and is in charge of communication control of the host system HOST and the second, third, and fourth display devices 10-2, 10-3, and 10-4, and a corresponding algorithm code for control is stored, and the controller 290 may be implemented by a micro controller unit (MCU) in which the stored algorithm code is executed.

The controller 290 controls to transmit a corresponding control instruction and data to the host system HOST and the second, third, and fourth display devices 10-2, 10-3, and 10-4 through the network communicator 270 according to an input and selection of the user input 250. Of course, in case that a control instruction and data are input from the host system HOST and the second, third, and fourth display devices 10-2, 10-3, and 10-4, an operation is performed according to the corresponding control instruction.

Since block diagrams of each of the second, third, and fourth display devices 10-2, 10-3, and 10-4 are substantially the same as the block diagram of the first display device 10-1 described with reference to FIG. 23, a description thereof is omitted.

Although the disclosure has been described with reference to the embodiments thereof, those skilled in the art will understand that the disclosure may be variously modified and changed without departing from the spirit and scope of the disclosure and as disclosed in the following claims.

What is claimed is:

1. A display device comprising:
   a display area; and
   a non-display area adjacent to the display area and including a pad portion, wherein the display area comprises:
      light emitting elements disposed in a first direction in a first pixel row;
      pixel circuits disposed in the first direction in a first circuit row and electrically connected to the light emitting elements of the first pixel row;
      light emitting elements disposed in the first direction in a second pixel row between the first pixel row and the first circuit row;
      pixel circuits disposed in the first direction in a second circuit row and electrically connected to the light emitting elements of the second pixel row; and
      a gate driver including a first stage disposed between the pixel circuits of the first circuit row that provide a gate signal to the pixel circuits of the first circuit row and a second stage disposed between the pixel circuits of the second circuit row that provides a gate signal to the pixel circuits of the second circuit row, and
   a distance between adjacent pixel circuits with the first stage disposed between the adjacent pixel circuits in the first circuit row is greater than a distance between other pixel circuits of the first circuit row.

2. The display device according to claim 1, wherein the first stage and the second stage are disposed in a second direction intersecting the first direction between adjacent unit pixel columns.

3. The display device according to claim 2, wherein the pixel circuits and the light emitting elements are shifted with respect to the second direction in a unit pixel column adjacent to the gate driver.

4. The display device according to claim 2, wherein a distance between the pixel circuit adjacent to the first stage and a pixel circuit closest to the pixel circuit adjacent to the first stage is less than a distance between other pixel circuits of the first circuit row.

5. The display device according to claim 2, wherein the display area comprises:
   light emitting elements disposed in the first direction in a third pixel row between the first circuit row and the second circuit row;
   pixel circuits disposed in the first direction in a third circuit row adjacent to the second circuit row in the second direction; and
   a third stage disposed between the pixel circuits of the third circuit row that provides a gate signal to the pixel circuits of the third circuit row.

6. The display device according to claim 5, wherein
   a distance between the first stage and the second stage is greater than a distance between the second stage and the third stage.

7. The display device according to claim 6, wherein the display area comprises:
   light emitting elements disposed in the first direction in a fourth pixel row adjacent to the third circuit row in the second direction;
   light emitting elements disposed in the first direction in a fifth pixel row spaced apart from the fourth pixel row in the second direction;
   pixel circuits respectively disposed in the first direction in a fourth circuit row and a fifth circuit row successively disposed between the fourth pixel row and the fifth pixel row;
   a fourth stage disposed between the pixel circuits of the fourth circuit row that provides a gate signal to the pixel circuits of the fourth circuit row; and
   a fifth stage disposed between the pixel circuits of the fifth pixel row that provides a gate signal to the pixel circuits of the fifth circuit row.

8. The display device according to claim 7, wherein
   a distance between the third stage and the fourth stage is substantially the same as the distance between the first stage and the second stage, and
   a distance between the fourth stage and the fifth stage is substantially the same as a distance between the second stage and the third stage.

9. The display device according to claim 7, wherein
   the display area comprises:
      light emitting elements disposed in the first direction in a sixth pixel row spaced apart from the fifth pixel row in the second direction;
      pixel circuits disposed in the first direction in a sixth circuit row adjacent to the sixth pixel row in the second direction; and
      a sixth stage disposed between the pixel circuits of the sixth circuit row that provides a gate signal to the pixel circuits of the sixth circuit row,
      pixel circuits are not disposed between the fifth pixel row and the sixth pixel row, and
   distances between adjacent pixel rows are substantially equal.

10. The display device according to claim 9, wherein a distance between the fifth stage and the sixth stage is greater than the distance between the first stage and the second stage.

11. The display device according to claim 1, wherein the display area comprises a demux disposed between the second pixel row and the first circuit row.

12. The display device according to claim 11, wherein
the display area comprises a fan-out area including fan-out lines disposed between the first pixel row and the demux, and
the fan-out lines electrically connect the pad portion and the demux.

13. The display device according to claim 12, wherein at least a portion of the fan-out lines overlap the light emitting elements of the second pixel row in a plan view.

14. The display device according to claim 12, wherein the display area comprises an electrostatic discharge circuit overlapping the light emitting elements of the first pixel row in the plan view.

15. The display device according to claim 1, wherein each of the light emitting elements is a flip chip micro light emitting diode.

16. A tiled display device comprising:
display devices and a coupling area connecting between the display devices, wherein
at least one of the display devices comprises:
a display area; and
a non-display area adjacent to the display area and including a pad portion,
the display area comprises:
light emitting elements disposed in a first direction in a first pixel row;
pixel circuits disposed in the first direction in a first circuit row and electrically connected to the light emitting elements of the first pixel row;
light emitting elements disposed in the first direction in a second pixel row between the first pixel row and the first circuit row;
pixel circuits disposed in the first direction in a second circuit row and electrically connected to the light emitting elements of the second pixel row; and
a gate driver including a first stage disposed between the pixel circuits of the first circuit row that provides a gate signal to the pixel circuits of the first circuit row and a second stage disposed between the pixel circuits of the second circuit row that provides a gate signal to the pixel circuits of the second circuit row, and
a distance between adjacent pixel circuits with the first stage disposed between the adjacent pixel circuits in the first circuit row is greater than a distance between other pixel circuits of the first circuit row.

17. The tiled display device according to claim 16, wherein
the first stage and the second stage are disposed in a second direction intersecting the first direction between adjacent unit pixel, and
the pixel circuits and the light emitting elements are shifted with respect to the second direction in a unit pixel column adjacent to the gate driver.

18. The tiled display device according to claim 17, wherein a distance between the pixel circuit adjacent to the first stage and a pixel circuit closest to the pixel circuit is less than a distance between other pixel circuits of the first circuit row.

19. The tiled display device according to claim 16, wherein
the at least one of the display devices comprises:
a substrate; and
a side surface connection line disposed on an upper surface of the substrate, a rear surface of the substrate, and a side surface between the upper surface and the rear surface, and connected to the pad portion, and
the pad portion is disposed on the upper surface of the substrate.

20. The tiled display device according to claim 19, wherein
the at least one of the display devices comprises:
a rear surface electrode disposed on the rear surface of the substrate; and
a flexible film connected to the rear surface electrode through a conductive adhesive member, and
the side surface connection line is electrically connected to the rear surface electrode.

21. The tiled display device according to claim 16, wherein each of the light emitting elements is a flip chip micro light emitting diode.

* * * * *